(12) United States Patent
Aketa

(10) Patent No.: US 12,051,662 B2
(45) Date of Patent: Jul. 30, 2024

(54) ELECTRONIC COMPONENT AND SEMICONDUCTOR DEVICE

(71) Applicant: ROHM CO., LTD., Kyoto (JP)

(72) Inventor: Masatoshi Aketa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/644,957

(22) Filed: Dec. 17, 2021

(65) Prior Publication Data

US 2022/0115342 A1 Apr. 14, 2022

Related U.S. Application Data

(63) Continuation of application No. 16/607,652, filed as application No. PCT/JP2018/016373 on Apr. 20, 2018, now Pat. No. 11,239,189.

(30) Foreign Application Priority Data

Apr. 24, 2017 (JP) .................................. 2017-085614

(51) Int. Cl.
*H01L 23/00* (2006.01)
*H01L 23/14* (2006.01)
(Continued)

(52) U.S. Cl.
CPC ............ *H01L 24/06* (2013.01); *H01L 23/147* (2013.01); *H01L 23/15* (2013.01);
(Continued)

(58) Field of Classification Search
CPC ....... H01L 24/06; H01L 23/147; H01L 23/15; H01L 23/3121; H01L 23/3672;
(Continued)

(56) References Cited

U.S. PATENT DOCUMENTS

| 6,864,574 B1 | 3/2005 | Nobori et al. |
| 2003/0080355 A1* | 5/2003 | Shirai ................. H01L 29/7802 257/E29.066 |

(Continued)

FOREIGN PATENT DOCUMENTS

| DE | 3709200 A1 | 9/1988 |
| DE | 102010060503 A1 | 6/2011 |

(Continued)

OTHER PUBLICATIONS

International Search Report and Written Opinion issued for International Patent Application No. PCT/JP2018/016373, Date of mailing: Jul. 10, 2018, 12 pages including English translation of Search Report.

(Continued)

*Primary Examiner* — Galina G Yushina
(74) *Attorney, Agent, or Firm* — XSENSUS LLP

(57) ABSTRACT

An electronic component includes a substrate having a first main surface on one side and a second main surface on the other side, a chip having a first chip main surface on one side and a second chip main surface on the other side, and a plurality of electrodes formed on the first chip main surface and/or the second chip main surface, the chip being arranged on the first main surface of the substrate, a sealing insulation layer that seals the chip on the first main surface of the substrate such that the second main surface of the substrate is exposed, the sealing insulation layer having a sealing main surface that opposes the first main surface of the substrate, and a plurality of external terminals formed to penetrate through the sealing insulation layer so as to be exposed from the sealing main surface of the sealing insulation layer, the external terminals being respectively electrically connected to the plurality of electrodes of the chip.

31 Claims, 34 Drawing Sheets

(51) Int. Cl.
*H01L 23/15* (2006.01)
*H01L 23/31* (2006.01)
*H01L 23/367* (2006.01)
*H01L 23/498* (2006.01)
*H01L 23/538* (2006.01)
*H01L 25/18* (2023.01)
*H01L 21/56* (2006.01)

(52) U.S. Cl.
CPC ...... *H01L 23/3121* (2013.01); *H01L 23/3672* (2013.01); *H01L 23/49838* (2013.01); *H01L 23/49894* (2013.01); *H01L 23/5386* (2013.01); *H01L 24/13* (2013.01); *H01L 24/32* (2013.01); *H01L 25/18* (2013.01); *H01L 21/561* (2013.01); *H01L 24/11* (2013.01); *H01L 24/29* (2013.01); *H01L 24/73* (2013.01); *H01L 24/83* (2013.01); *H01L 24/97* (2013.01); *H01L 2224/0401* (2013.01); *H01L 2224/04026* (2013.01); *H01L 2224/06181* (2013.01); *H01L 2224/11462* (2013.01); *H01L 2224/1162* (2013.01); *H01L 2224/1184* (2013.01); *H01L 2224/13016* (2013.01); *H01L 2224/13022* (2013.01); *H01L 2224/13147* (2013.01); *H01L 2224/29339* (2013.01); *H01L 2224/29344* (2013.01); *H01L 2224/29347* (2013.01); *H01L 2224/32227* (2013.01); *H01L 2224/73253* (2013.01); *H01L 2224/83801* (2013.01); *H01L 2924/10253* (2013.01); *H01L 2924/10272* (2013.01); *H01L 2924/1033* (2013.01); *H01L 2924/1203* (2013.01); *H01L 2924/13055* (2013.01); *H01L 2924/13091* (2013.01)

(58) Field of Classification Search
CPC ......... H01L 23/49838; H01L 23/49894; H01L 22/5386; H01L 24/13; H01L 24/32; H01L 25/18; H01L 21/561; H01L 24/11; H01L 24/29; H01L 24/73; H01L 24/83
See application file for complete search history.

(56) References Cited

U.S. PATENT DOCUMENTS

| | | | |
|---|---|---|---|
| 2004/0089944 A1 | 5/2004 | Watanabe | |
| 2005/0059238 A1* | 3/2005 | Chen | H01L 23/3677 257/E23.105 |
| 2006/0012017 A1 | 1/2006 | Fujisawa et al. | |
| 2009/0160046 A1* | 6/2009 | Otremba | H01L 24/82 257/700 |
| 2009/0189259 A1* | 7/2009 | Mohamed | H01L 24/40 438/123 |
| 2009/0246910 A1 | 10/2009 | Taniguchi et al. | |
| 2010/0012951 A1 | 1/2010 | Yatsuo et al. | |
| 2010/0019381 A1* | 1/2010 | Haeberlen | H01L 23/49541 257/737 |
| 2010/0078783 A1* | 4/2010 | Otremba | H01L 23/142 257/676 |
| 2010/0078784 A1* | 4/2010 | Otremba | H01L 24/37 257/676 |
| 2011/0215478 A1* | 9/2011 | Yamamichi | H01L 24/19 257/773 |
| 2012/0235162 A1 | 9/2012 | Isobe et al. | |
| 2013/0221493 A1* | 8/2013 | Kim | H01L 21/6835 257/774 |
| 2013/0320533 A1* | 12/2013 | Tao | H01L 24/16 257/738 |
| 2017/0263516 A1 | 9/2017 | Ishimaru et al. | |

FOREIGN PATENT DOCUMENTS

| | | |
|---|---|---|
| DE | 102013104337 A1 | 11/2013 |
| DE | 102014111829 A1 | 2/2015 |
| JP | H6-252300 A | 9/1994 |
| JP | 2001223321 | 8/2001 |
| JP | 2005079431 | 3/2005 |
| JP | 2006032556 | 2/2006 |
| JP | 2007-103716 A | 4/2007 |
| JP | 2009026945 | 2/2009 |
| JP | 2009188376 | 8/2009 |
| JP | 2009231690 | 10/2009 |
| JP | 2013172044 | 9/2013 |
| JP | 2015005681 | 1/2015 |
| JP | 2015056564 | 3/2015 |
| JP | 2016058594 | 4/2016 |
| JP | 2016-195178 A | 11/2016 |
| WO | 2010147202 | 12/2010 |

OTHER PUBLICATIONS

International Preliminary Report on Patentability issued for International Patent Application No. PCT/JP2018/016373, Date of mailing: Nov. 7, 2019, 22 pages including English translation.
Office Action issued for German Patent Application No. 112018003873.4, dated Sep. 15, 2022, 21 pages including informal English translation.
Office Action issued for Chinese Patent Application No. 201880026608.8, dated Nov. 29, 2022, 11 pages including English machine translation.
Office Action issued on Jun. 22, 2023, in corresponding Japanese patent Application No. 2022-165010, 8 pages.
Office Action issued on Dec. 7, 2023, in corresponding Japanese patent Application No. 2022-165010, 3 pages.

\* cited by examiner

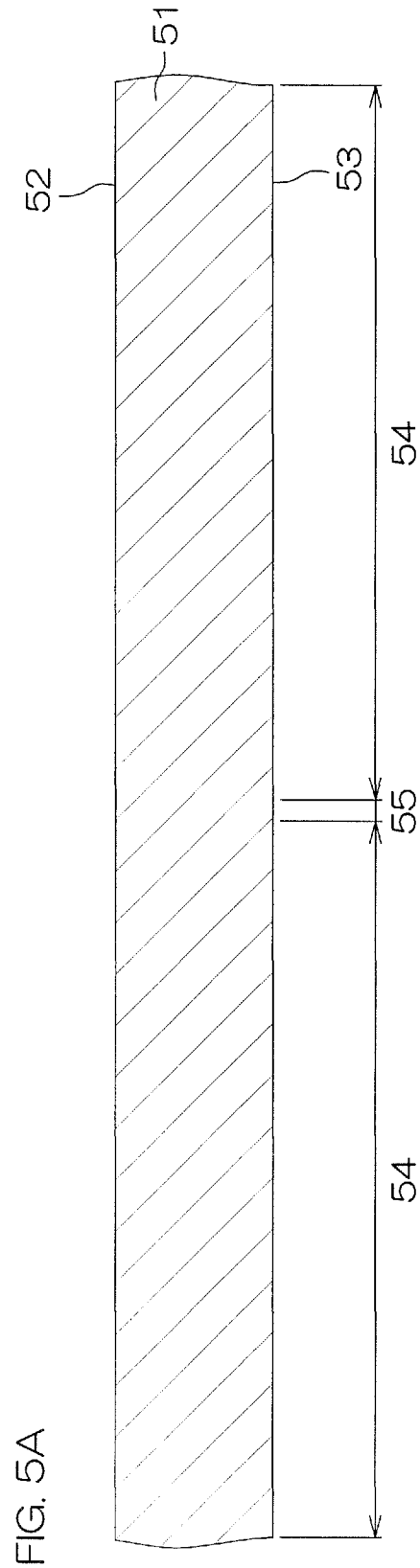

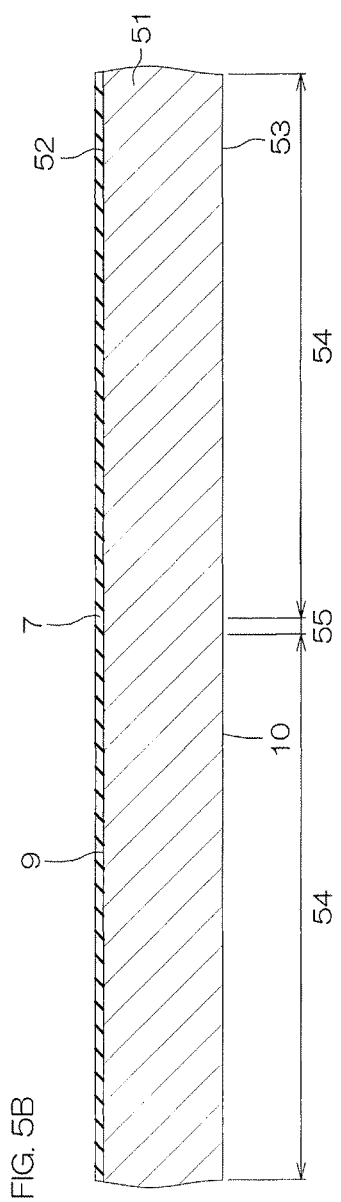

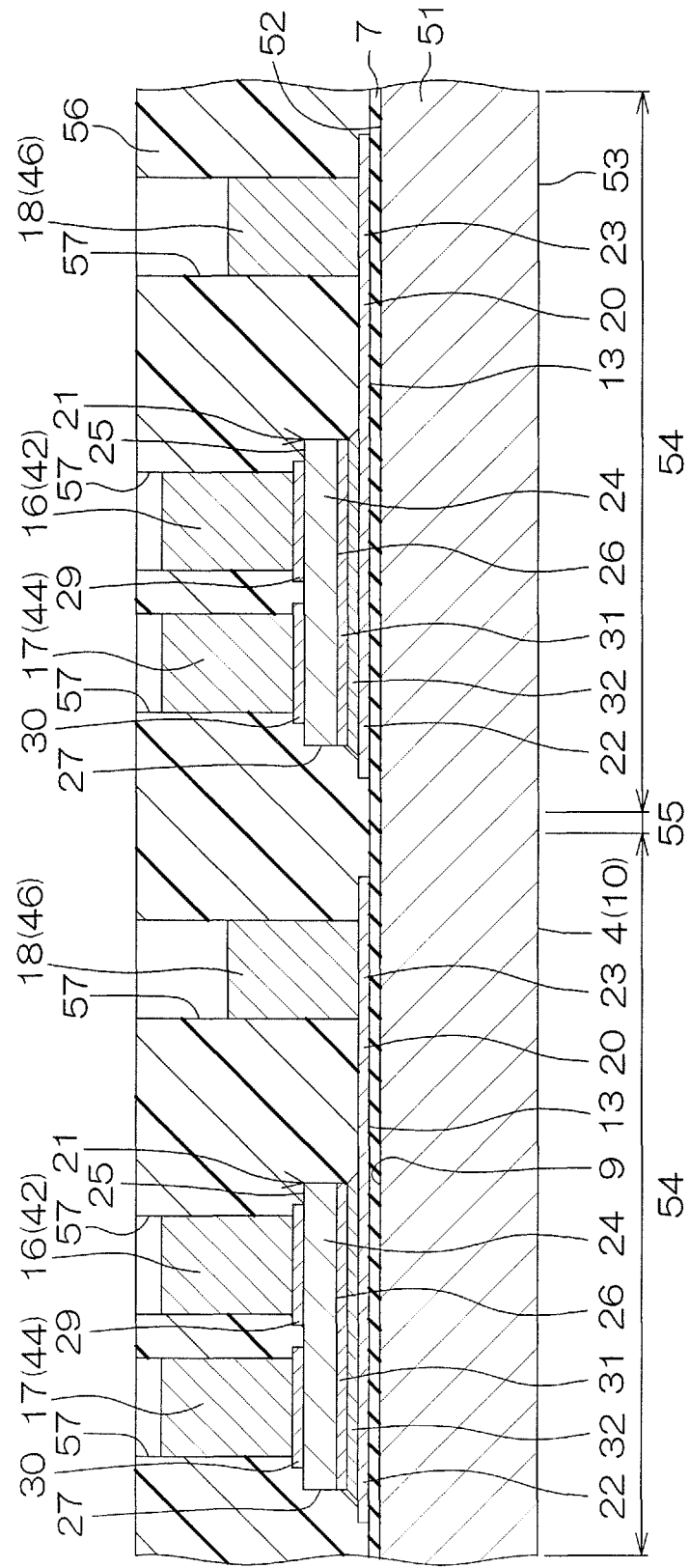

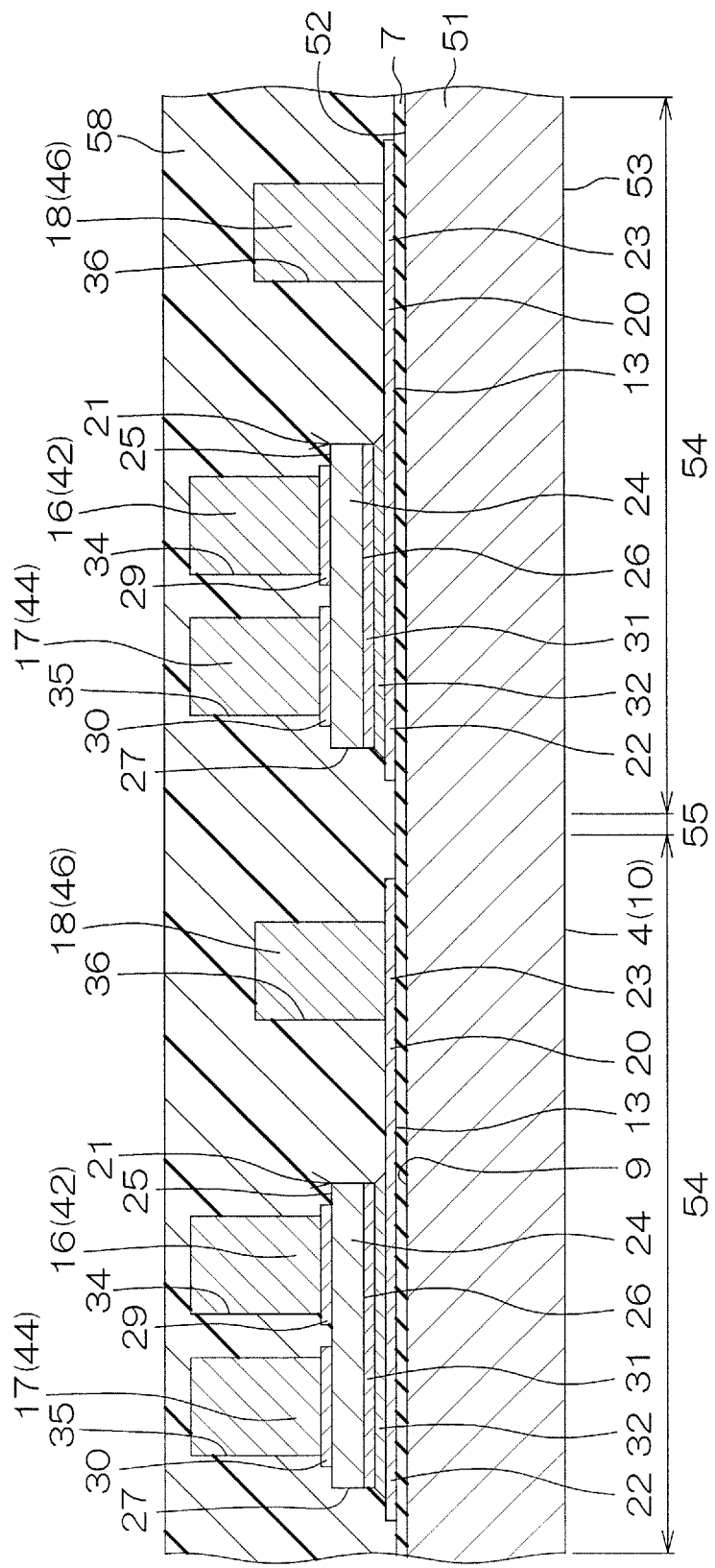

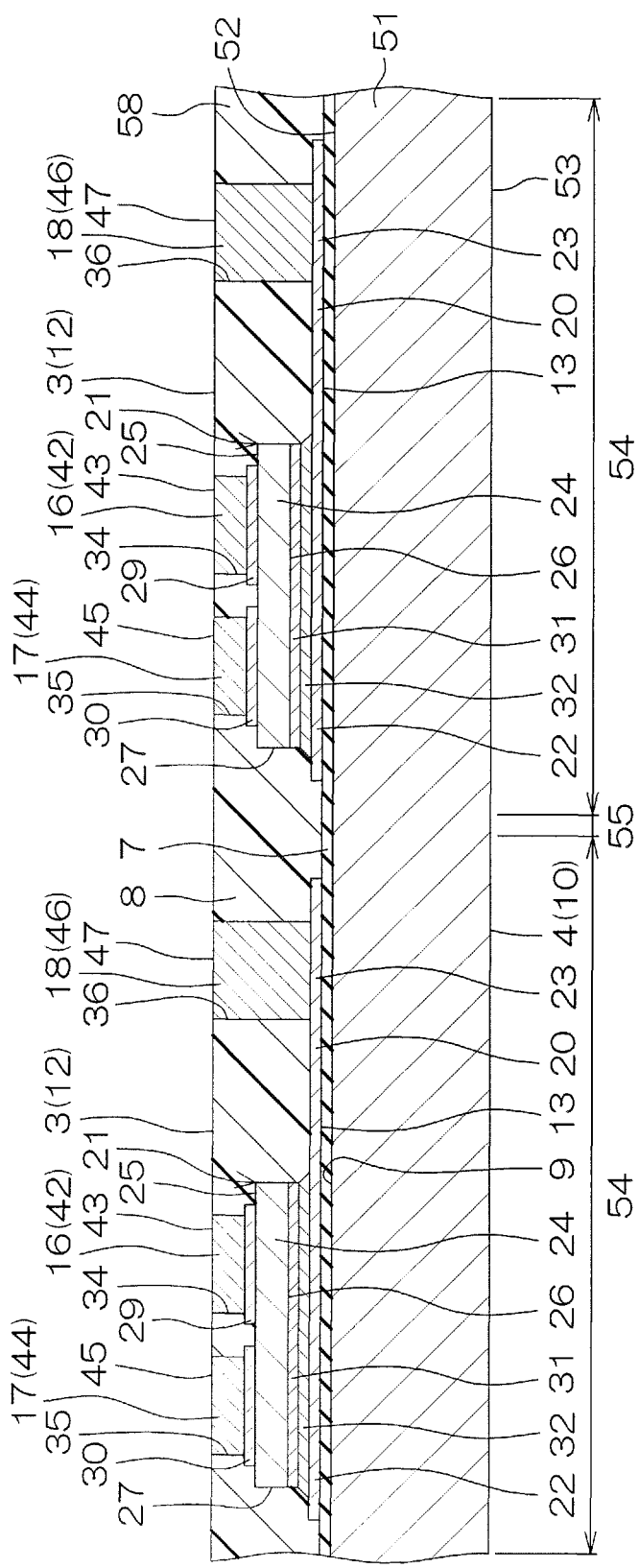

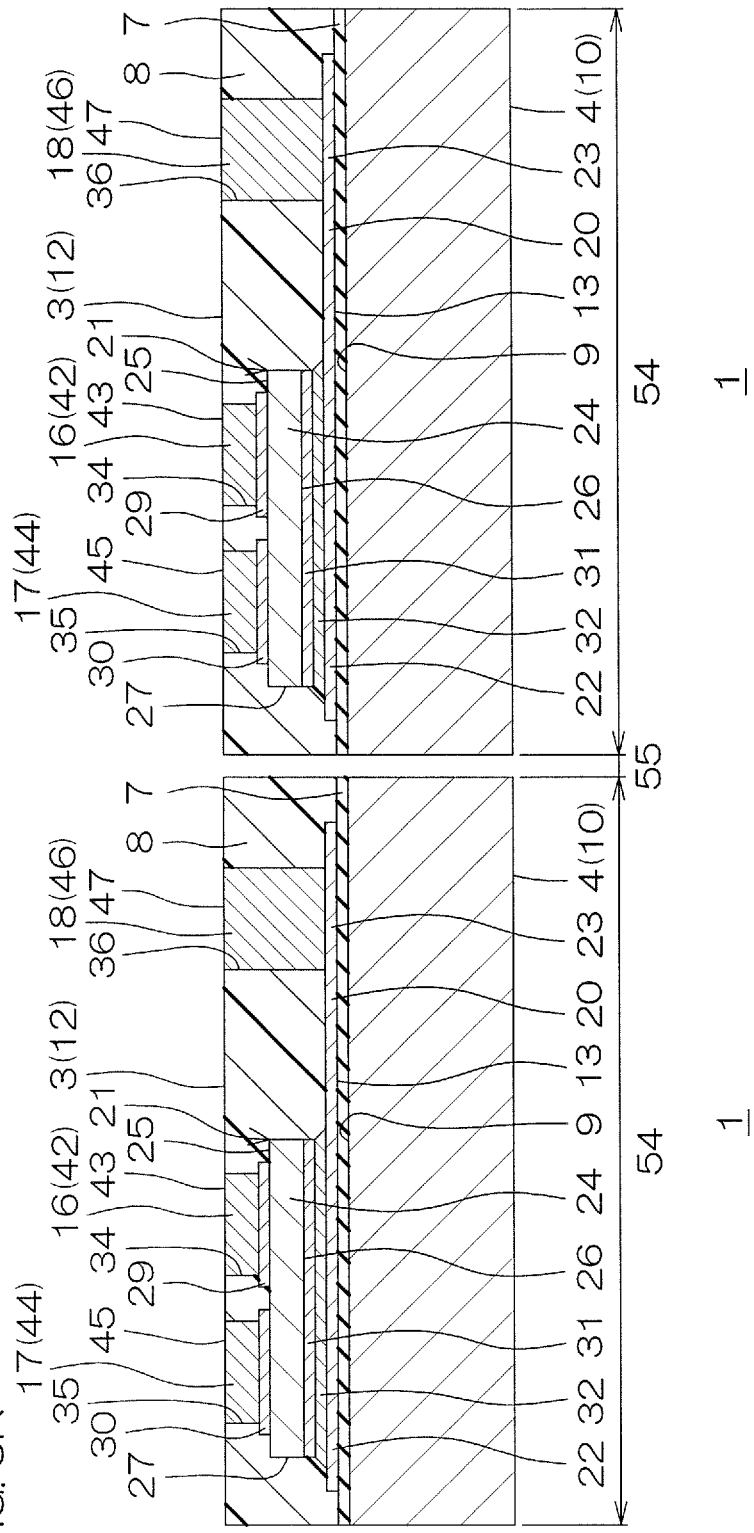

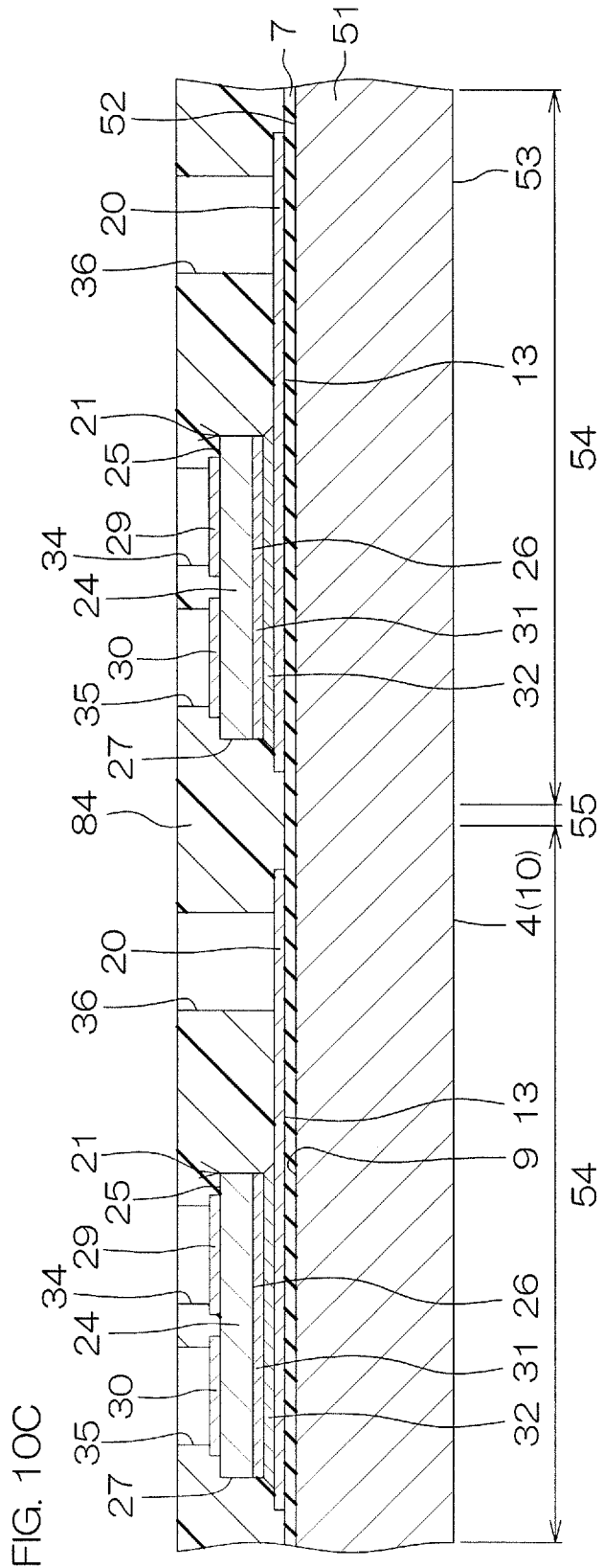

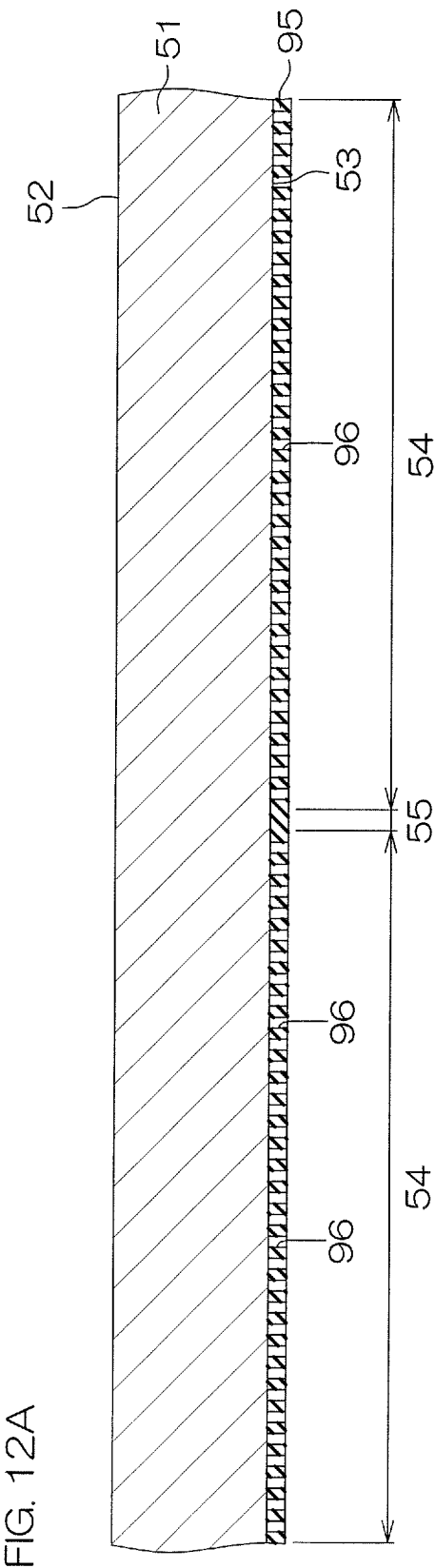

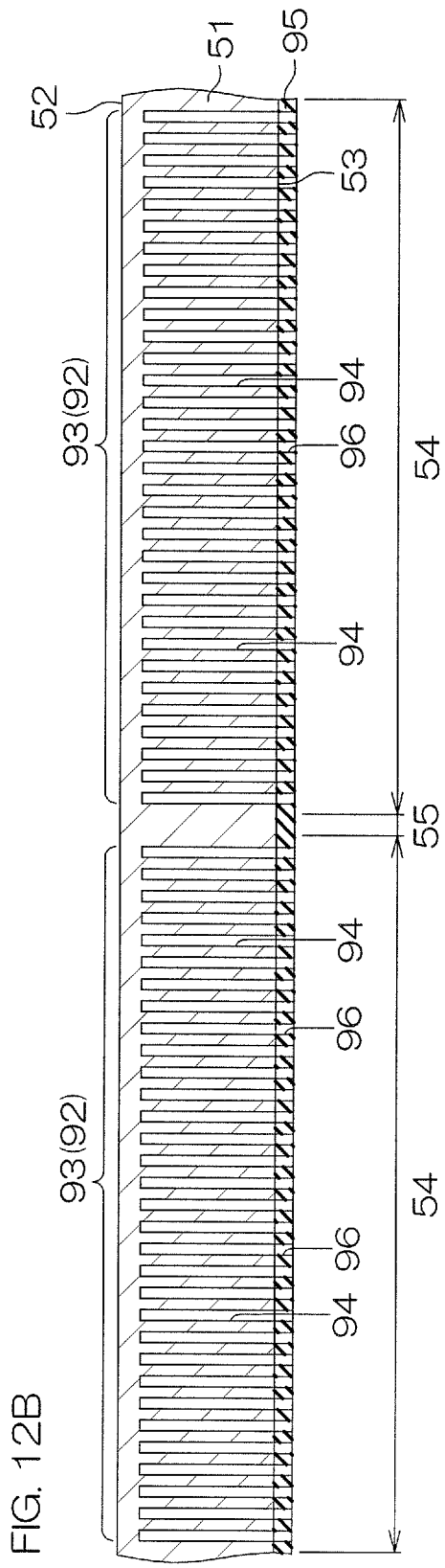

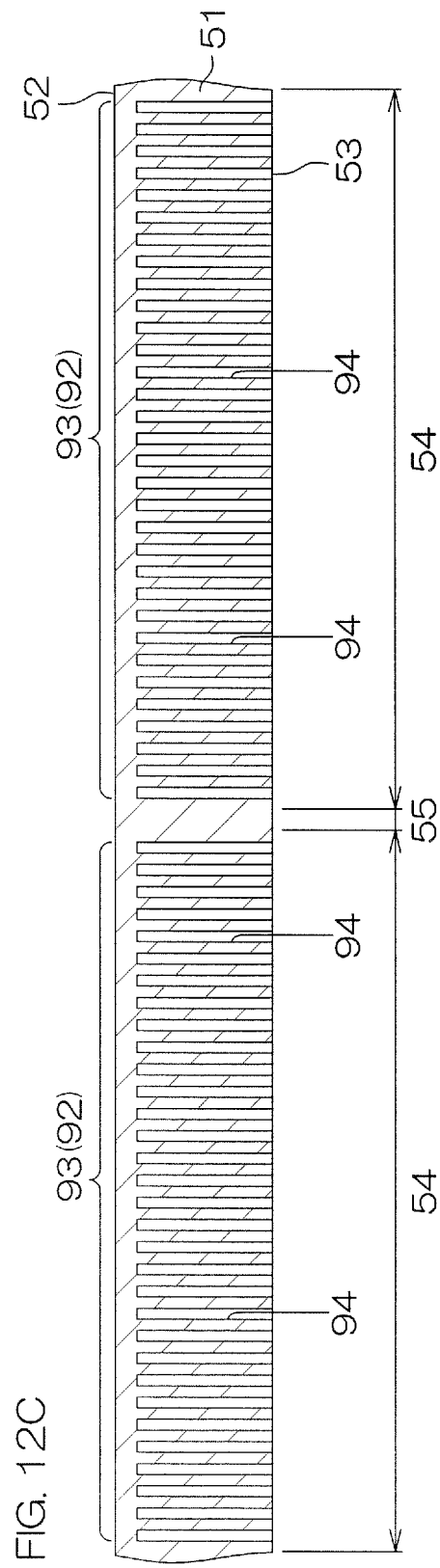

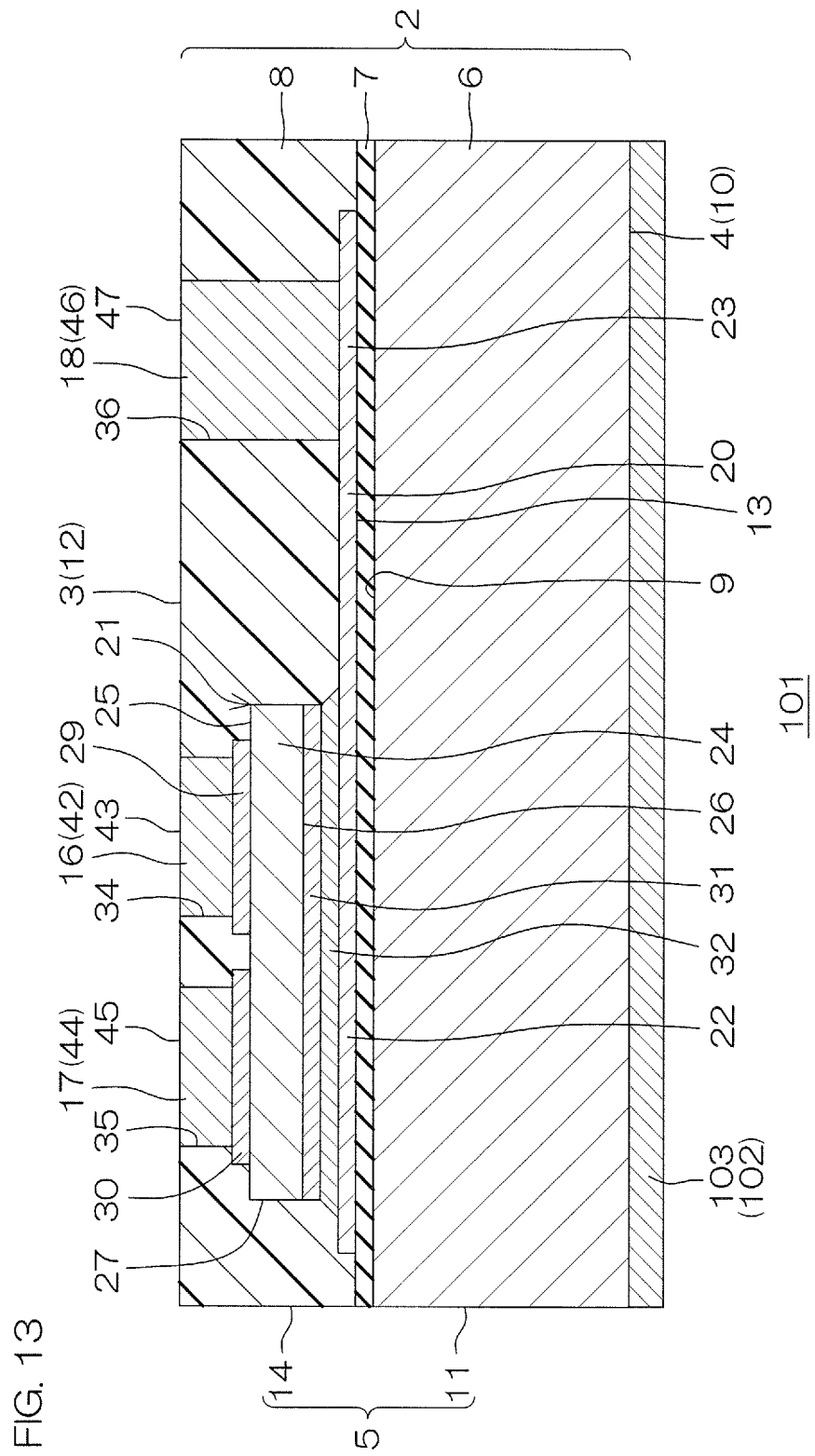

ELECTRONIC COMPONENT AND SEMICONDUCTOR DEVICE

TECHNICAL FIELD

The present invention relates to an electronic component and a semiconductor device.

BACKGROUND ART

Patent Literature 1 discloses a power module semiconductor device serving as an example of an electronic component. The power module semiconductor device includes a ceramic substrate. A semiconductor device and terminal electrodes are arranged on the ceramic substrate.

The terminal electrodes cross a side surface of the ceramic substrate and are extended from an inside region to an outside region of the ceramic substrate. The terminal electrodes are electrically connected to the semiconductor device via bonding wires.

Pillar-shaped electrodes stand on the semiconductor device. The ceramic substrate, the semiconductor device, and part of the pillar electrodes and the terminal electrodes are sealed by a resin layer. The resin layer is formed over the entire outer surface of the ceramic substrate.

CITATION LIST

Patent Literature

Patent Literature 1: Japanese Patent Application Publication No. 2013-172044

SUMMARY OF INVENTION

Technical Problem

In the conventional power module semiconductor device, the entire outer surface of the ceramic substrate is covered with the resin layer, therefore, heat generated in the semiconductor device easily remains in the resin layer. Therefore, the heat in the resin layer is dissipated to the outside of the resin layer by extending the terminal electrodes to the outside of the resin layer. The terminal electrodes are required to be connected to the semiconductor device via connection members such as the bonding wires. Downsizing of an electronic component is inhibited by this type of design.

Thus, a preferred embodiment of the present invention provides an electronic component and a semiconductor device with which downsizing and an improvement in heat dissipation can be performed at the same time.

Solution to Problem

A preferred embodiment of the present invention provides an electronic component including a substrate having a first main surface on one side and a second main surface on the other side, a chip having a first chip main surface on one side and a second chip main surface on the other side, and a plurality of electrodes formed on the first chip main surface and/or the second chip main surface, the chip being arranged on the first main surface of the substrate, a sealing insulation layer that seals the chip on the first main surface of the substrate such that the second main surface of the substrate is exposed, the sealing insulation layer having a sealing main surface that opposes the first main surface of the substrate, and a plurality of external terminals formed to penetrate through the sealing insulation layer so as to be exposed from the sealing main surface of the sealing insulation layer, the external terminals being respectively electrically connected to the plurality of electrodes of the chip.

With this electronic component, the second main surface of the substrate is exposed from the sealing insulation layer. Therefore, even when the external terminals are not extended from a side surface of the substrate, heat generated in the chip can be dissipated to the outside from the second main surface of the substrate.

Moreover, since it is unnecessary to extend the external terminals from the side surface of the substrate, it is no longer required to use connection members such as bonding wires. Thereby, shrinkage due to a reduction in the number of parts can be achieved. Therefore, it is possible to provide an electronic component that can achieve downsizing and improvement in heat dissipation at the same time.

A preferred embodiment of the present invention provides a semiconductor device including a semiconductor substrate having a first main surface on one side and a second main surface on the other side, a main surface insulation layer formed on the first main surface of the semiconductor substrate, a semiconductor chip having a plurality of electrodes, the semiconductor chip being arranged in the main surface insulation layer, a sealing insulation layer that seals the semiconductor chip on the first main surface of the semiconductor substrate such that the second main surface of the semiconductor substrate is exposed, the sealing insulation layer having a sealing main surface that opposes the first main surface of the semiconductor substrate, and a plurality of external terminals formed to penetrate through the sealing insulation layer so as to be exposed from the sealing main surface of the sealing insulation layer, the external terminals being respectively electrically connected to the plurality of electrodes of the semiconductor chip.

With this semiconductor device, the second main surface of the semiconductor substrate is exposed from the sealing insulation layer. Therefore, even when the external terminals are not extended from a side surface of the semiconductor substrate, heat generated in the semiconductor chip can be dissipated to the outside from the second main surface of the semiconductor substrate.

Moreover, since it is unnecessary to extend the external terminals from the side surface of the semiconductor substrate, it is no longer required to use connection members such as bonding wires. Thereby, the shrinkage due to the reduction in the number of parts can be achieved. Therefore, it is possible to provide a semiconductor device that can achieve downsizing and improvement in heat dissipation at the same time.

In particular, with this semiconductor device, the main surface insulation layer is formed on the first main surface of the semiconductor substrate. Thereby, while gaining benefits of a heat dissipating effect by the semiconductor substrate, a dielectric strength amount with respect to applied voltage to the semiconductor chip can be improved.

The aforementioned or yet other objects, features, and effects of the present invention will be clarified by the following description of preferred embodiments with reference to the accompanying drawings.

BRIEF DESCRIPTION OF DRAWINGS

FIG. 5A is a sectional view for describing an example of a manufacturing method of the electronic component of FIG. 1.

FIG. 5B is a sectional view showing a process after FIG. 5A.

FIG. 5F is a sectional view showing a process after FIG. 5E.

FIG. 5H is a sectional view showing a process after FIG. 5G.

FIG. 5J is a sectional view showing a process after FIG. 5I.

FIG. 5K is a sectional view showing a process after FIG. 5J.

FIG. 10C is a sectional view showing a process after FIG. 10B.

FIG. 12A is a sectional view for describing an example of a manufacturing method of the electronic component of FIG. 11.

FIG. 12B is a sectional view showing a process after FIG. 12A.

FIG. 12C is a sectional view showing a process after FIG. 12B.

FIG. 13 is a sectional view of a part corresponding to FIG. 3, the view for describing a structure of an electronic component according to a fifth preferred embodiment of the present invention.

DESCRIPTION OF EMBODIMENTS

Figure 1:
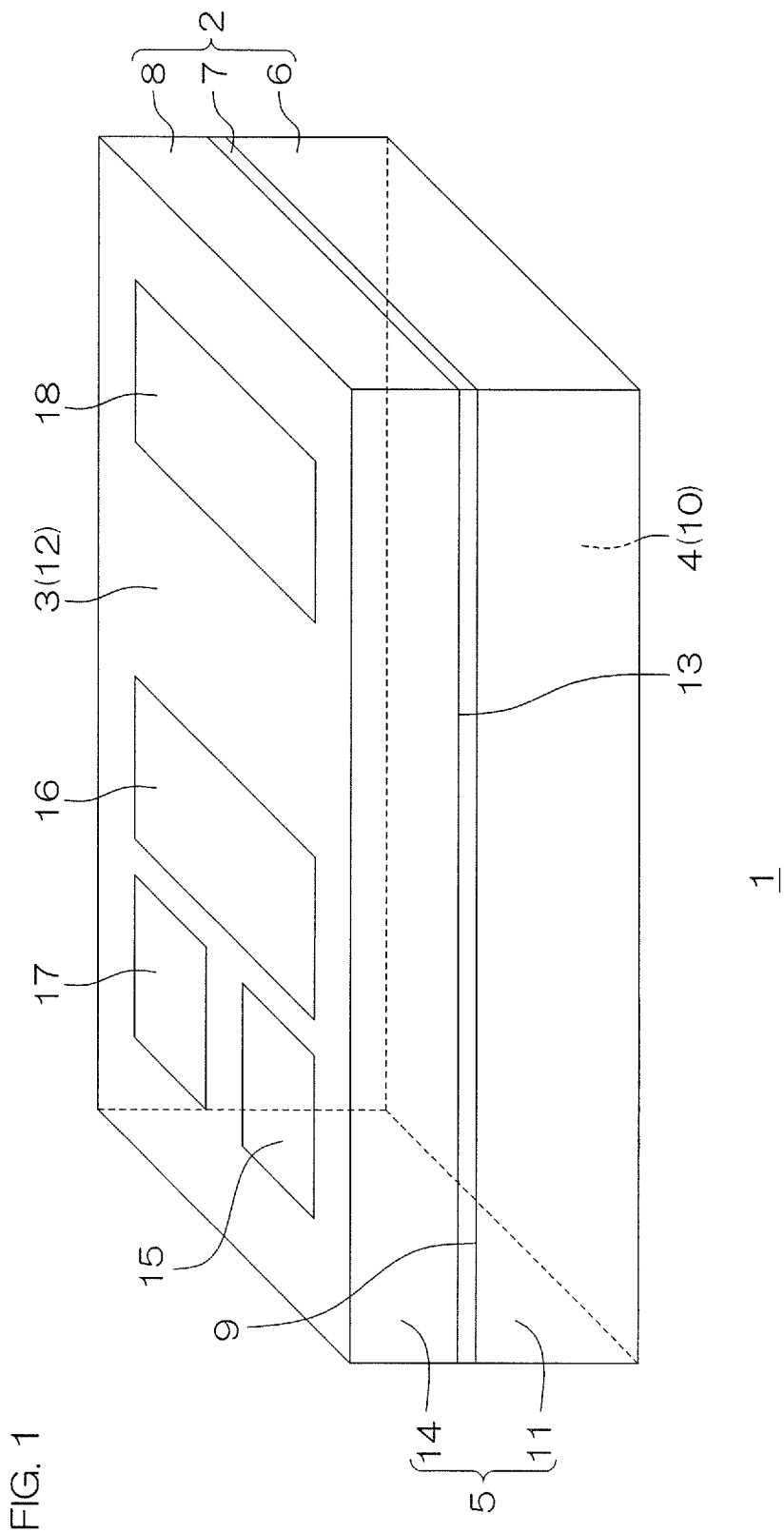
FIG. 1 is a perspective view of an electronic component according to a first preferred embodiment of the present invention.

FIG. 1 is a perspective view of an electronic component 1 according to a first preferred embodiment of the present invention.

The electronic component 1 is a semiconductor device including a MISFET (Metal Insulator Semiconductor Field Effect Transistor) serving as an example of a semiconductor switching device. The electronic component 1 may include a MISFET that performs switching control of a large current. In this embodiment, the MISFET has a so-called vertical structure having a gate electrode, a source electrode, and a source sense electrode on one surface side of a chip, and having a drain electrode on the other surface side of the chip.

With reference to FIG. 1, the electronic component 1 includes a component main body 2 formed in a rectangular parallelepiped. The component main body 2 includes a mounting surface 3 on one side, a non-mounting surface 4 on the other side, and a side surface 5 connecting the mounting surface 3 and the non-mounting surface 4. The mounting surface 3 is an opposing surface that opposes an object to be connected in a case where the electronic component 1 is mounted on the object to be connected such as a mounting substrate.

The mounting surface 3 and the non-mounting surface 4 are formed in a square shape (rectangular shape in this embodiment) in a plan view seen from a normal direction thereof (hereinafter, simply referred to as "the plan view"). The side surface 5 of the component main body 2 may be a grinding surface. The side surface 5 may have a grinding mark.

The component main body 2 has a laminated structure including a substrate 6, a main surface insulation layer 7, and a sealing insulation layer 8. The substrate 6 is formed in a rectangular parallelepiped. The substrate 6 includes a first substrate main surface 9 on one side, a second substrate main surface 10 on the other side, and a substrate side surface 11 connecting the first substrate main surface 9 and the second substrate main surface 10. The substrate 6 efficiently dissipates heat generated in the MISFET to the outside.

The first substrate main surface 9 and the second substrate main surface 10 are formed in a square shape (rectangular shape in this embodiment) in the plan view. The second substrate main surface 10 of the substrate 6 forms the non-mounting surface 4 of the component main body 2. The substrate side surface 11 of the substrate 6 forms part of the side surface 5 of the component main body 2.

The substrate 6 is preferably made of a material having a thermal conductivity of not less than 100 W/mK. The substrate 6 may include a substrate made of a material to be supplied for manufacturing a semiconductor element, a semiconductor device, etc. That is, the substrate 6 may include a semiconductor substrate.

The semiconductor substrate is superior to other materials from a viewpoint of the thermal conductivity, availability, workability, cost, etc. In a case where the semiconductor substrate is used as the substrate 6, a thickness of the semiconductor substrate is preferably not less than 50 μm and not more than 1,000 μm in consideration of stress to the MISFET and heat dissipation.

The substrate 6 may be a semiconductor substrate to which impurities are added, or may be a semiconductor substrate to which no impurities are added. The semiconductor substrate may be a single-crystal substrate or may be a polycrystal substrate.

The semiconductor substrate may include a silicon substrate, a silicon carbide substrate, a sapphire substrate, or a compound semiconductor substrate. A nitride semiconductor substrate and an oxide semiconductor substrate may be included in the compound semiconductor substrate. In this embodiment, an example in which the substrate 6 is formed by a silicon substrate serving as an example of the semiconductor substrate will be described.

The main surface insulation layer 7 covers the entire first substrate main surface 9 of the substrate 6. The main surface insulation layer 7 is provided in order to insulate between the MISFET and the substrate 6. In a case where a heat dissipation plate, etc., is attached to the substrate 6, the main surface insulation layer 7 also insulates between the MISFET and the heat dissipation plate, etc. The main surface insulation layer 7 forms part of the side surface 5 of the component main body 2. The main surface insulation layer 7 preferably has a breakdown field strength of at least not less than 1 MV/cm.

The main surface insulation layer 7 may include at least one type of silicon oxide, silicon nitride, silicon oxynitride, aluminum oxide, aluminum nitride, anf aluminum oxynitride.

The main surface insulation layer 7 is preferably formed by a semiconductor manufacturing process such as a CVD (Chemical Vapor Deposition) method and a PVD (Physical Vapor Deposition) method. With these methods, film quality of the main surface insulation layer 7 can be improved.

Thereby, the main surface insulation layer 7 having a sufficiently high breakdown field strength while having a relatively small thickness can be formed. Also, by reducing the thickness of the main surface insulation layer 7, a decrease in the thermal conductivity can be suppressed. In addition, by connecting a heat dissipator, etc., to the second substrate main surface 10 side, a further heat dissipating effect can be obtained.

The thickness of the main surface insulation layer 7 may be not less than 0.1 μm and not more than 100 μm. The thickness of the main surface insulation layer 7 is preferably not less than 0.1 μm and not more than 10 μm from a viewpoint of the thermal conductivity and manufacturing efficiency. The main surface insulation layer 7 is preferably made of an insulating material having a relatively high thermal conductivity.

For example, the thermal conductivity of silicon nitride is higher than the thermal conductivity of silicon oxide. Therefore, as the insulating material of the main surface insulation layer 7, silicon nitride is preferably adopted. In addition to silicon nitride, an insulating material having a higher thermal conductivity than the thermal conductivity of silicon oxide is suitable as the insulating material of the main surface insulation layer 7.

The sealing insulation layer 8 is formed in a rectangular parallelepiped. The sealing insulation layer 8 protects, for example, the MISFET from humidity, etc. The sealing insulation layer 8 includes a first sealing main surface 12 on one side, a second sealing main surface 13 on the other side, and a sealing side surface 14 connecting the first sealing main surface 12 and the second sealing main surface 13. The first sealing main surface 12 and the second sealing main surface 13 are formed in a square shape (rectangular shape in this embodiment) in the plan view.

The first sealing main surface 12 of the sealing insulation layer 8 forms the mounting surface 3 of the component main body 2. The second sealing main surface 13 of the sealing insulation layer 8 is connected to the main surface insulation layer 7. The sealing side surface 14 of the sealing insulation layer 8 forms part of the side surface 5 of the component main body 2. The sealing side surface 14 of the sealing insulation layer 8 and the substrate side surface 11 of the substrate 6 are formed to be substantially flush with each other.

The sealing insulation layer 8 may include at least one type of silicon oxide, silicon nitride, polyimide resin, or epoxy resin. The sealing insulation layer 8 may include a positive type or negative type photoresist. The sealing insulation layer 8 is formed by a sealing resin layer including epoxy resin in this embodiment.

A thickness of the sealing insulation layer 8 is greater than the thickness of the main surface insulation layer 7. The thickness of the sealing insulation layer 8 may be not less than 10 μm and not more than 8,000 μm (approximately 300 μm in the present preferred embodiment).

The electronic component 1 includes a gate external terminal 15, a source external terminal 16, a source sense external terminal 17, and a drain external terminal 18. The gate external terminal 15, the source external terminal 16, and the source sense external terminal 17 are respectively formed as chip side external terminals. The drain external terminal 18 is formed as a wiring layer side external terminal.

The gate external terminal 15, the source external terminal 16, the source sense external terminal 17, and the drain external terminal 18 are respectively electrically connected to a gate terminal electrode 28, a source terminal electrode 29, a source sense terminal electrode 30, and a drain terminal electrode 31 of a MISFET 24 to be described later (see FIG. 5, etc., together).

The gate external terminal 15, the source external terminal 16, and the source sense external terminal 17 are formed in a region on one end portion side of the component main body 2 in the plan view. The drain external terminal 18 is formed in a region on the other end portion side of the component main body 2 in the plan view.

All of the gate external terminal 15, the source external terminal 16, the source sense external terminal 17, and the drain external terminal 18 penetrate through the sealing insulation layer 8, and are exposed from the first sealing main surface 12 of the sealing insulation layer 8. That is, all of the gate external terminal 15, the source external terminal 16, the source sense external terminal 17, and the drain external terminal 18 are exposed from the mounting surface 3 of the component main body 2.

All of the gate external terminal 15, the source external terminal 16, the source sense external terminal 17, and the drain external terminal 18 are formed in a region enclosed by a peripheral edge of the substrate 6. That is, the gate external terminal 15, the source external terminal 16, the source sense external terminal 17, and the drain external terminal 18 are arranged in a region above the first substrate main surface 9 of the substrate 6 without crossing the substrate side surface 11 of the substrate 6.

The gate external terminal 15, the source external terminal 16, the source sense external terminal 17, and the drain external terminal 18 are respectively formed in a square shape in the plan view. The gate external terminal 15, the source external terminal 16, the source sense external terminal 17, and the drain external terminal 18 may be respectively formed in an arbitrary shape other than the square shape in the plan view. The gate external terminal 15, the source external terminal 16, the source sense external terminal 17, and the drain external terminal 18 may be respectively formed in a circular shape in the plan view.

As described above, the electronic component 1 has a structure in which the plurality of external terminals are exposed from the mounting surface 3 of the component main body 2 and no external terminals are exposed from the non-mounting surface 4 and the side surface 5 of the component main body 2.

Figure 2:
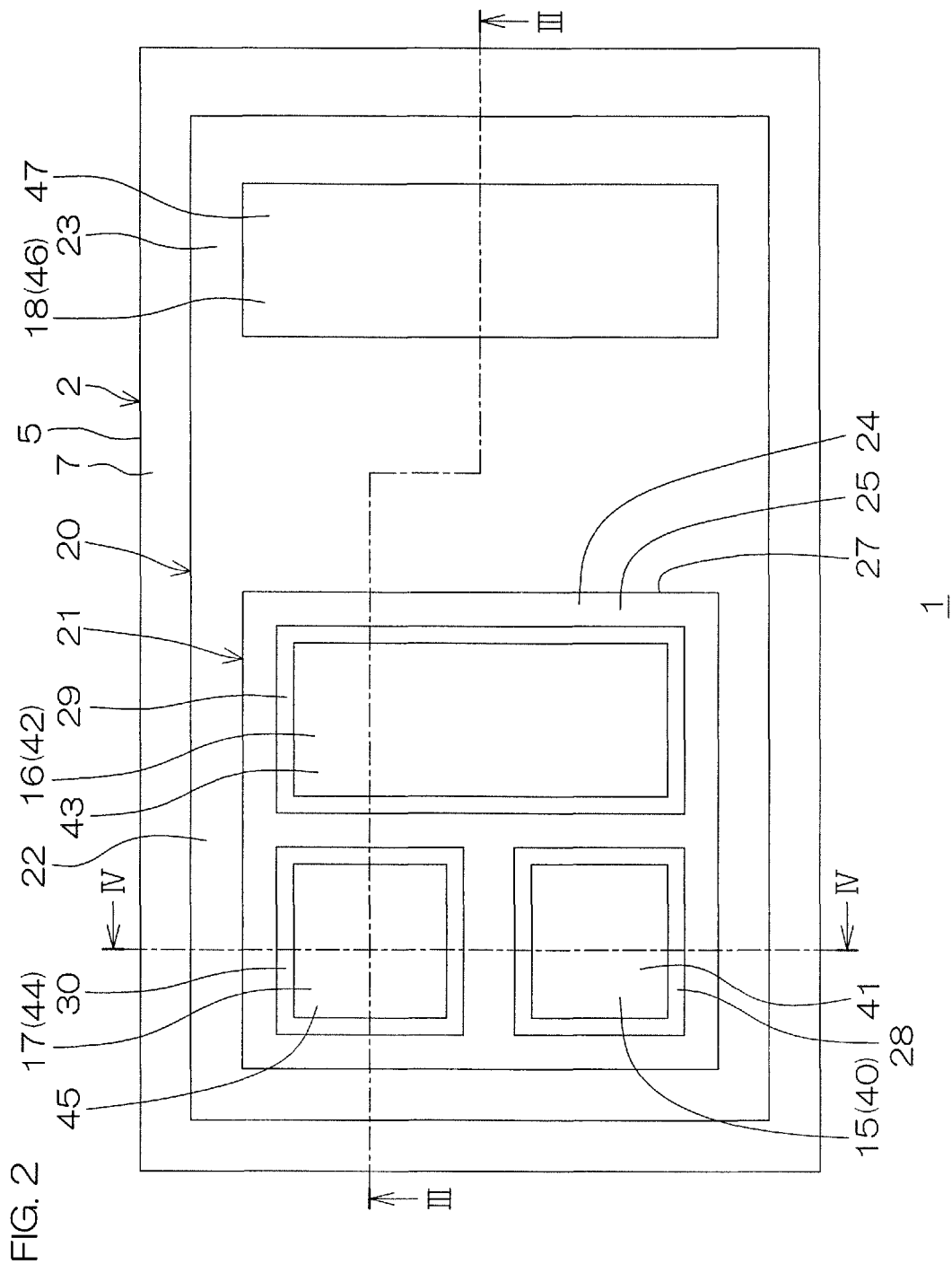
FIG. 2 is a plan view for describing an internal structure of the electronic component of FIG. 1.
Figure 3:
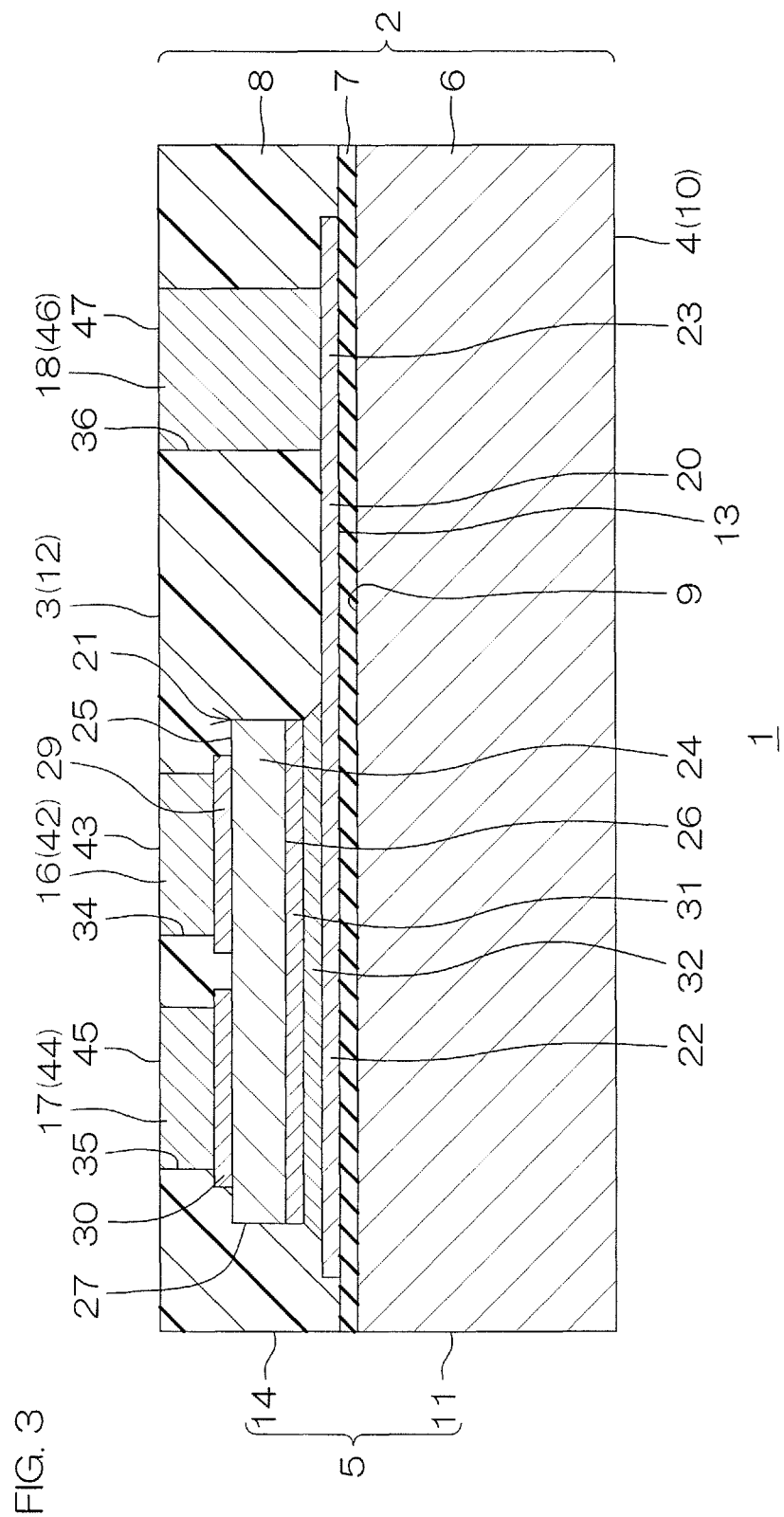
FIG. 3 is a sectional view taken along line III-III of FIG. 2.
Figure 4:
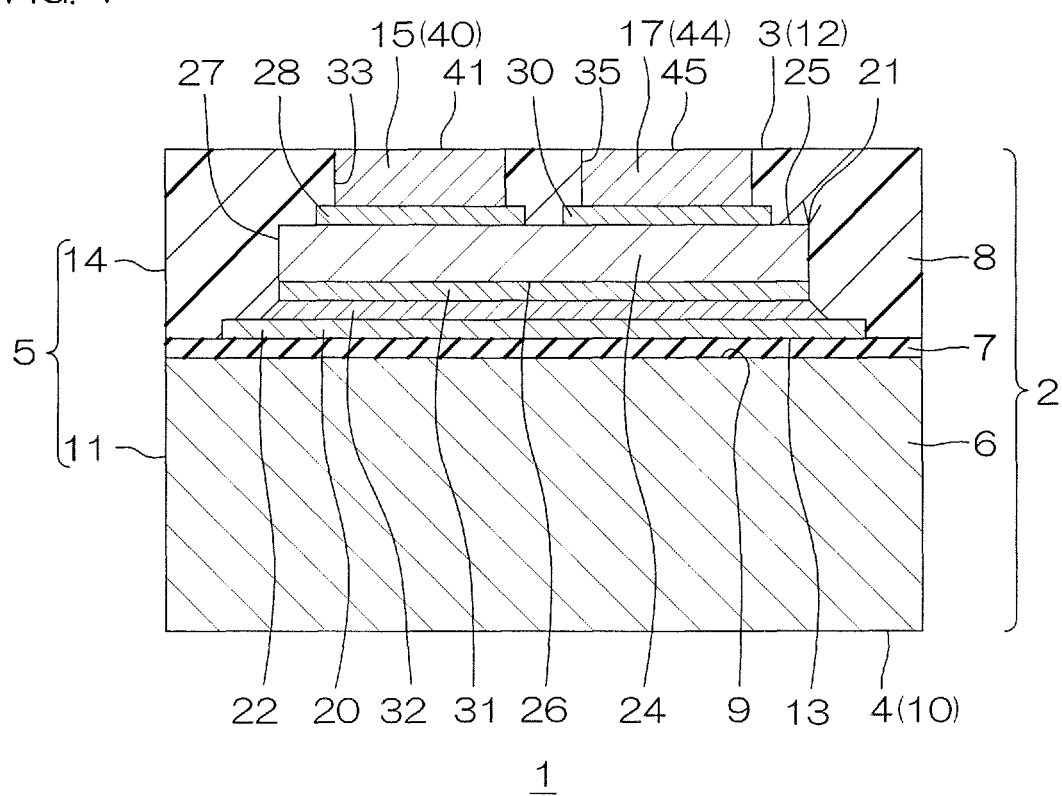
FIG. 4 is a sectional view taken along line IV-IV of FIG. 2.

FIG. 2 is the plan view for describing an internal structure of the electronic component 1 of FIG. 1. FIG. 3 is a sectional view taken along line III-III of FIG. 2. FIG. 4 is a sectional view taken along line IV-IV of FIG. 2.

With reference to FIGS. 2 to 4, the electronic component 1 includes a wiring layer 20 and a MISFET chip 21. The wiring layer 20 is formed on the main surface insulation layer 7. The wiring layer 20 is formed in a square shape in the plan view. More specifically, the wiring layer 20 is formed in a rectangular shape extending along the longitudinal direction of the substrate 6. The wiring layer 20 may be a copper wiring layer including copper as a main component.

The wiring layer 20 may include a copper seed layer and a copper plating layer laminated in this order from the main surface insulation layer 7 side. The wiring layer 20 may include a barrier layer including titanium. In this case, the copper seed layer may be formed on the barrier layer.

The wiring layer 20 includes a first connection region 22 and a second connection region 23. The first connection region 22 and the second connection region 23 are regions to which different members are connected, respectively. The first connection region 22 is formed in a region on one end portion side of the substrate 6 in the plan view. The second connection region 23 is formed in a region on the other end portion side of the substrate 6 with respect to the first connection region 22 in the plan view.

The wiring layer 20 may take any mode as long as the first connection region 22 and the second connection region 23 are included. For example, the wiring layer 20 may include an island-shaped first connection region 22, an island-shaped second connection region 23, and a linear connection region connecting the first connection region 22 and the second connection region 23.

In this case, the first connection region 22 and the second connection region 23 may be formed in an arbitrary shape such as a square shape and a circular shape in the plan view. The connection region may be selectively drawn in a region between the first connection region 22 and the second connection region 23.

The MISFET chip 21 includes a chip main body 24 formed in a rectangular parallelepiped. The chip main body 24 includes a first chip main surface 25 on one side, a second chip main surface 26 on the other side, and a chip side surface 27 connecting the first chip main surface 25 and the second chip main surface 26. The first chip main surface 25 of the MISFET chip 21 is a device formation surface on which a circuit device is formed.

The MISFET chip 21 may be a Si-MISFET chip having a chip main body 24 that includes Si. A withstand voltage of the Si-MISFET chip may be not less than 30 V and not more than 4,500 V. The withstand voltage of the MISFET chip is defined by a maximum voltage VDS applicable between a drain and a source.

The MISFET chip 21 may be a MISFET chip having a chip main body 24 that includes a compound semiconductor. The chip main body 24 may include a nitride semiconductor or an oxide semiconductor as the compound semiconductor.

The nitride semiconductor may include gallium nitride (GaN). The oxide semiconductor may include gallium oxide ($Ga_2O_3$). A withstand voltage of the MISFET chip including the compound semiconductor may be not less than 600 V and not more than 10,000 V.

The MISFET chip 21 may be a SiC-MISFET chip having a chip main body 24 that includes SiC. A withstand voltage of the SiC-MISFET chip may be not less than 600 V and not more than 15,000 V.

Especially, with the MISFET chip including the compound semiconductor and the SiC-MISFET chip, a temperature may become high by heat generation due to a large current. The electronic component 1 has a structure beneficial for these high-power type chips.

The MISFET chip 21 includes a gate terminal electrode layer 28, a source terminal electrode layer 29, a source sense terminal electrode layer 30, and a drain terminal electrode layer 31. The gate terminal electrode layer 28, the source terminal electrode layer 29, and the source sense terminal electrode layer 30 are selectively formed on the first chip main surface 25 of the chip main body 24. The drain terminal electrode layer 31 is connected to the second chip main surface 26 of the chip main body 24.

The MISFET chip 21 is bonded to the first connection region 22 of the wiring layer 20 in a posture that the second chip main surface 26 of the chip main body 24 opposes the first substrate main surface 9 of the substrate 6. The drain terminal electrode layer 31 is bonded to the first connection region 22 of the wiring layer 20 via a conductive bonding material 32. That is, the wiring layer 20 forms a drain wiring layer.

The conductive bonding material 32 may include low-melting-point metal or metal paste. The low-melting-point metal may include a solder, etc. The metal paste may include copper paste, silver paste, and gold paste, etc.

Arrangement, a shape, size, etc., of the gate terminal electrode layer 28, the source terminal electrode layer 29, the source sense terminal electrode layer 30, and the drain terminal electrode layer 31 are not limited to particular modes. For the arrangement, the shape, the size, etc., of the gate terminal electrode layer 28, the source terminal electrode layer 29, the source sense terminal electrode layer 30, and the drain terminal electrode layer 31, various modes may be adopted based on the specifications of the MISFET chip 21.

For example, the gate terminal electrode layer 28, the source terminal electrode layer 29, and/or the source sense terminal electrode layer 30 may include an island-shaped pad portion and a linear line portion selectively drawn from the pad portion onto the first chip main surface 25 of the chip main body 24.

The MISFET chip 21 may include a multilayer wiring structure formed on the first chip main surface 25 of the chip main body 24. The multilayer wiring structure may have a structure in which a wiring layer and an insulation layer are alternately laminated. The gate terminal electrode layer 28, the source terminal electrode layer 29, and/or the source sense terminal electrode layer 30 may be formed as an uppermost wiring layer in the multilayer wiring structure.

With reference to FIGS. 3 and 4, the sealing insulation layer 8 seals the MISFET chip 21 on the first substrate main surface 9 of the substrate 6 (more specifically, on the main surface insulation layer 7). A gate pad opening 33, a source pad opening 34, a source sense pad opening 35, and a drain pad opening 36 are formed in the sealing insulation layer 8.

The gate pad opening 33 selectively exposes the gate terminal electrode layer 28 of the MISFET chip 21. The source pad opening 34 selectively exposes the source terminal electrode layer 29 of the MISFET chip 21.

The source sense pad opening 35 selectively exposes the source sense terminal electrode layer 30 of the MISFET chip 21. The drain pad opening 36 selectively exposes the second connection region 23 of the wiring layer 20.

The gate external terminal 15 is embedded in the gate pad opening 33. The gate external terminal 15 is connected to the gate terminal electrode layer 28 in the gate pad opening 33. The gate external terminal 15 includes a gate pillar-shaped electrode layer 40 of a pillar shape standing along the normal direction of the first chip main surface 25 of the chip main body 24.

The gate pillar-shaped electrode layer 40 includes a gate connection portion 41 to be externally connected. The gate connection portion 41 is exposed from the first sealing main surface 12 of the sealing insulation layer 8. The gate connection portion 41 has a connection surface which is flush with the first sealing main surface 12 of the sealing insulation layer 8.

The gate pillar-shaped electrode layer 40 may be a copper electrode layer including copper as a main component. The gate pillar-shaped electrode layer 40 may include a copper seed layer and a copper plating layer formed on the copper seed layer. The gate pillar-shaped electrode layer 40 may further include a barrier layer including titanium. In this case, the copper seed layer may be formed on the barrier layer.

The source external terminal 16 is embedded in the source pad opening 34. The source external terminal 16 is connected to the source terminal electrode layer 29 in the source pad opening 34. The source external terminal 16 includes a source pillar-shaped electrode layer 42 of a pillar shape standing along the normal direction of the first chip main surface 25 of the chip main body 24.

The source pillar-shaped electrode layer 42 includes a source connection portion 43 to be externally connected. The source connection portion 43 is exposed from the first sealing main surface 12 of the sealing insulation layer 8. The source connection portion 43 has a connection surface which is flush with the first sealing main surface 12 of the sealing insulation layer 8. The source pillar-shaped electrode layer 42 may have a similar arrangement to the arrangement of the gate pillar-shaped electrode layer 40.

The source sense external terminal 17 is embedded in the source sense pad opening 35. The source sense external terminal 17 is connected to the source sense terminal electrode layer 30 in the source sense pad opening 35. The source sense external terminal 17 includes a source sense pillar-shaped electrode layer 44 of a pillar shape standing along the normal direction of the first chip main surface 25 of the chip main body 24.

The source sense pillar-shaped electrode layer 44 includes a source sense connection portion 45 to be externally connected. The source sense pillar-shaped electrode layer 44 is exposed from the first sealing main surface 12 of the sealing insulation layer 8. The source sense connection portion 45 has a connection surface which is flush with the first sealing main surface 12 of the sealing insulation layer 8. The source sense pillar-shaped electrode layer 44 may have a similar arrangement to the arrangement of the gate pillar-shaped electrode layer 40.

The drain external terminal 18 is embedded in the drain pad opening 36. The drain external terminal 18 is connected to the second connection region 23 of the wiring layer 20 in the drain pad opening 36.

The drain external terminal 18 is electrically connected to the drain terminal electrode layer 31 of the MISFET chip 21 via the wiring layer 20. The drain external terminal 18 includes a drain pillar-shaped electrode layer 46 of a pillar shape standing along the normal direction of the first substrate main surface 9 of the substrate 6.

The drain pillar-shaped electrode layer 46 includes a drain connection portion 47 to be externally connected. The drain pillar-shaped electrode layer 46 is exposed from the first sealing main surface 12 of the sealing insulation layer 8. The drain connection portion 47 has a connection surface which is flush with the first sealing main surface 12 of the sealing insulation layer 8. The drain pillar-shaped electrode layer 46 may have a similar arrangement to the arrangement of the gate pillar-shaped electrode layer 40.

As described above, in the electronic component 1, the substrate 6 is formed by a semiconductor substrate having a relatively high thermal conductivity. The substrate side surface 11 of the substrate 6 is exposed from the sealing insulation layer 8. Moreover, in the electronic component 1, the substrate side surface 11 of the substrate 6 of the substrate 6 is also exposed from the sealing insulation layer 8.

Therefore, even when the external terminals are not extended from the substrate side surface 11 of the substrate 6, heat generated in the MISFET chip 21 can be efficiently dissipated to the outside from the second substrate main surface 10 and the substrate side surface 11 of the substrate 6. Thereby, a temperature rise inside the sealing insulation layer 8 can be appropriately suppressed.

Moreover, it is unnecessary to extend the gate external terminal 15, the source external terminal 16, the source sense external terminal 17, and the drain external terminal 18 from the substrate side surface 11 of the substrate 6. Therefore, it is no longer required to use connection members such as bonding wires for connection of these external terminals to the MISFET chip 21. As a result, shrinkage due to a reduction in the number of parts can be achieved. Therefore, it is possible to provide the electronic component 1 that can achieve downsizing and improvement in heat dissipation at the same time.

In particular, in the electronic component 1, the entire regions of all of the gate external terminal 15, the source external terminal 16, the source sense external terminal 17, and the drain external terminal 18 are formed in the region enclosed by the peripheral edge of the substrate 6.

Further, the gate external terminal 15, the source external terminal 16, and the source sense external terminal 17 are fitted in a square region enclosed by a peripheral edge of the MISFET chip 21 in the plan view.

Thereby, it is no longer required to arrange the MISFET 21, the gate external terminal 15, the source external terminal 16, and the source sense external terminal 17 so as to be adjacent to each other along the first substrate main surface 9 of the substrate 6. Therefore, the electronic component 1 can be appropriately downsized from a viewpoint of a layout of a plurality of external terminals.

In a case where the substrate 6 is formed by a semiconductor substrate, the electronic component 1 can be manufactured by utilizing a manufacturing process of a semiconductor device. That is, the minute MISFET chip 21 can be arranged on the miniaturized substrate 6. Therefore, in a case where the substrate 6 is formed by a semiconductor substrate, the electronic component 1 can be downsized also from a viewpoint of a manufacturing process of a semiconductor device.

In the electronic component 1, the main surface insulation layer 7 is formed on the first substrate main surface 9 of the substrate 6. Thereby, while gaining benefits of a heat dissipating effect by the semiconductor substrate, a dielectric strength amount with respect to applied voltage to the MISFET chip 21 can be improved. In particular, in a case where the main surface insulation layer 7 is made of silicon nitride, the heat dissipation and the dielectric strength amount can be appropriately improved.

In the electronic component 1, the wiring layer 20 is formed on the first substrate main surface 9 of the substrate 6. The wiring layer 20 has a planar area greater than a planar area of the MISFET chip 21.

Thereby, the heat generated in the MISFET chip 21 can be efficiently transmitted to the main surface insulation layer 7 and the substrate 6 via the wiring layer 20. Therefore, the temperature rise inside the sealing insulation layer 8 can be efficiently suppressed.

It is considered that, a resistance value is increased due to a reduction in an area of a current pathway in a small electronic component. With regard to this point, in the electronic component 1, the gate external terminal 15 includes the gate pillar-shaped electrode layer 40. The source external terminal 16 includes the source pillar-shaped electrode layer 42. The source sense external terminal 17 includes the source sense pillar-shaped electrode layer 44. The drain external terminal 18 includes the drain pillar-shaped electrode layer 46.

Thereby, a current pathway having a relatively wide area in comparison to connection members such as bonding wires can be ensured. Therefore, a rise in the resistance value can be suppressed. Especially, in a case where all of the gate pillar-shaped electrode layer 40, the source pillar-shaped electrode layer 42, the source sense pillar-shaped electrode layer 44, and the drain pillar-shaped electrode layer 46 include copper, the rise in the resistance value can be effectively suppressed.

Further, in the electronic component 1, all of the gate external terminal 15, the source external terminal 16, the source sense external terminal 17, and the drain external terminal 18 are exposed from the mounting surface 3 of the component main body 2.

Thereby, in a case where the electronic component 1 is mounted on the object to be connected such as a mounting substrate, the heat generated in the MISFET chip 21 can be transmitted to the object to be connected via the plurality of external terminals. Therefore, the plurality of external terminals can also contribute to an improvement in the heat dissipation.

FIGS. 5A to 5K are sectional views for describing an example of a manufacturing method of the electronic component 1 of FIG. 1. In a manufacturing process of the electronic component 1, a plurality of electronic components 1 are manufactured at the same time. However, FIGS. 5A to 5K show only a region where two electronic components 1 are formed for convenience of description.

First, with reference to FIG. 5A, a plate-shaped base substrate 51 serving as a base of the substrate 6 is prepared. A material of the base substrate 51 is selected in accordance with the material of the substrate 6. The base substrate 51 is formed by a silicon wafer in this embodiment.

The base substrate 51 includes a first substrate main surface 52 on one side and a second substrate main surface 53 on the other side. The first substrate main surface 52 of the base substrate 51 corresponds to the first substrate main surface 9 of the substrate 6. The second substrate main surface 53 of the base substrate 51 corresponds to the second substrate main surface 10 of the substrate 6.

In the base substrate 51, a plurality of component formation regions 54 and a border region 55 that partitions the plurality of component formation regions 54 are set. The component formation regions 54 are regions where the electronic components 1 are formed. The border region 55 is a dicing line.

Next, with reference to FIG. 5B, the main surface insulation layer 7 is formed on the first substrate main surface 52 of the base substrate 51. In this case, the main surface insulation layer 7 made of silicon nitride is formed. The main surface insulation layer 7 is formed with a thickness corresponding to the insulation withstand voltage to be achieved.

The thickness of the main surface insulation layer 7 may be not less than 0.1 μm and not more than 100 μm (preferably, not less than 0.1 μm and not more than 10 μm). The main surface insulation layer 7 may be formed by a CVD method or a PVD method.

The main surface insulation layer 7 including silicon oxide in place of or in addition to silicon nitride may be formed. In this case, the main surface insulation layer 7 may be formed by a CVD method. The main surface insulation layer 7 may be formed by oxidizing a surface of the base substrate 51 by an oxidation processing method. The oxidation processing method may be a thermal oxidation processing method or a wet oxidation processing method.

Figure 5C:
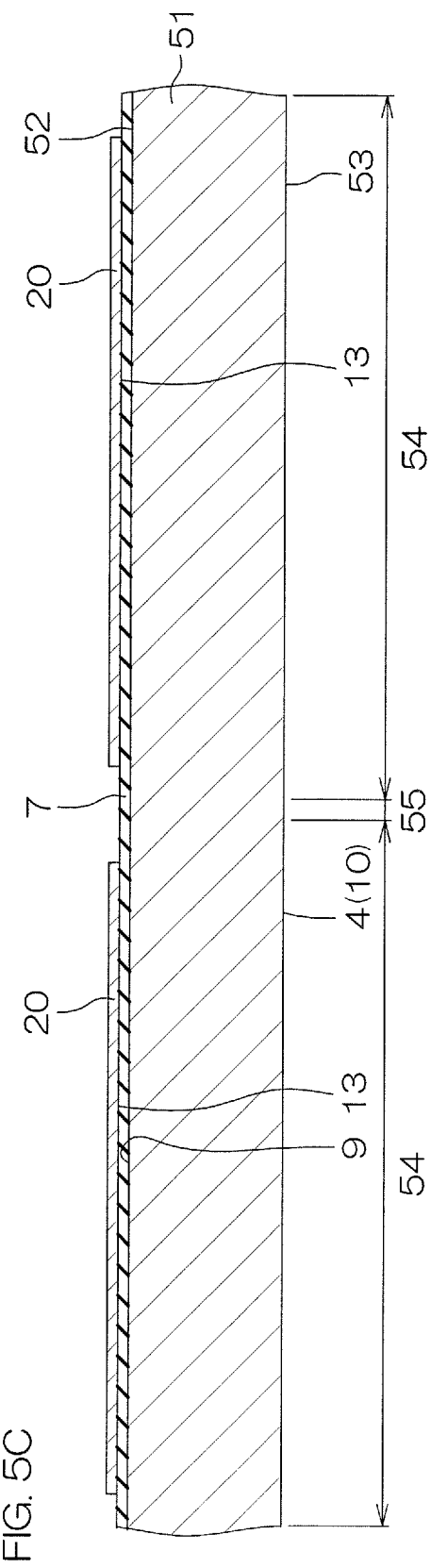
FIG. 5C is a sectional view showing a process after FIG. 5B.

Next, with reference to FIG. 5C, the wiring layers 20 are respectively formed in the component formation regions 54. In this process, first, the barrier layer including titanium (not shown) and the copper seed layer (not shown) are formed on the main surface insulation layer 7. The barrier layer and the copper seed layer may be respectively formed by a sputtering method.

Next, the copper plating layer (not shown) is formed on the copper seed layer. The copper plating layer may be formed by an electrolytic copper plating method. Next, a laminated film including the barrier layer, the copper seed layer, and the copper plating layer is selectively removed by an etching method via a resist mask (not shown). Thereby, the wiring layers 20 are respectively formed in the component formation regions 54.

Figure 5D:
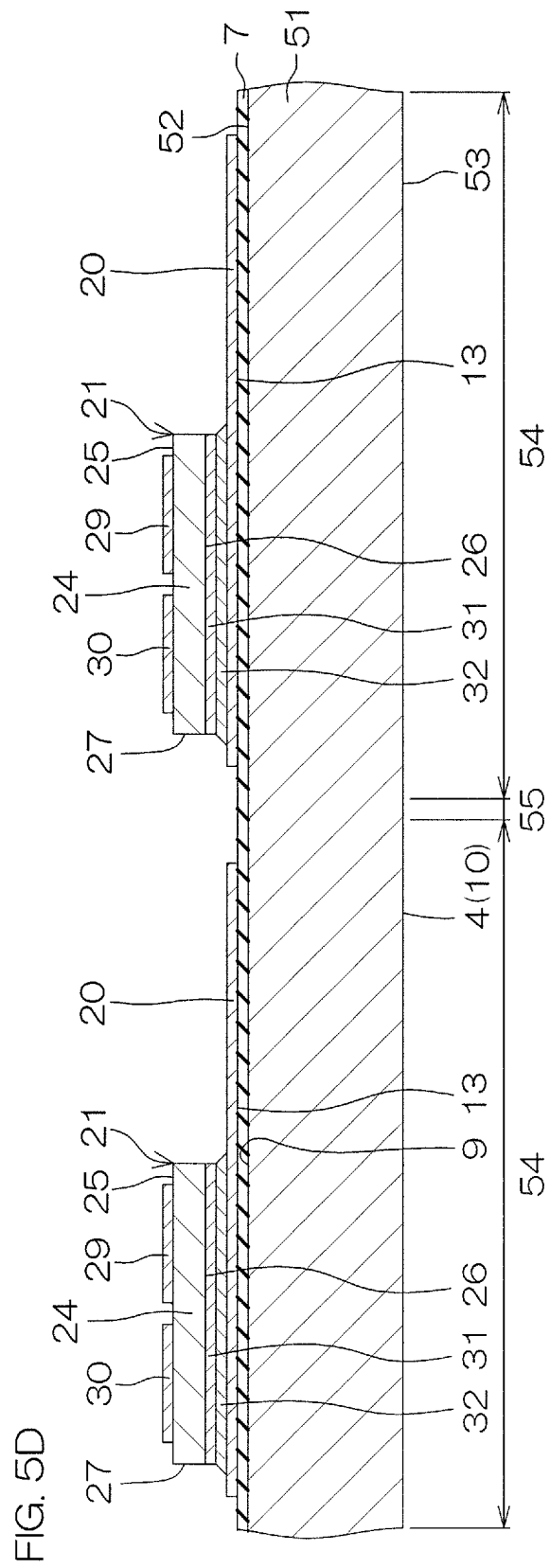
FIG. 5D is a sectional view showing a process after FIG. 5C.

Next, with reference to FIG. 5D, the MISFET chips 21 are respectively bonded to the wiring layers 20. Each of the MISFET chips 21 is bonded to the first connection region 22 of each of the wiring layers 20 via the conductive bonding material 32.

The conductive bonding material 32 may be a solder. An arrangement of the MISFET chip 21 and a mode of connecting the MISFET chip 21 to each wiring layer 20 are as already described with FIGS. 1 to 4.

Figure 5E:
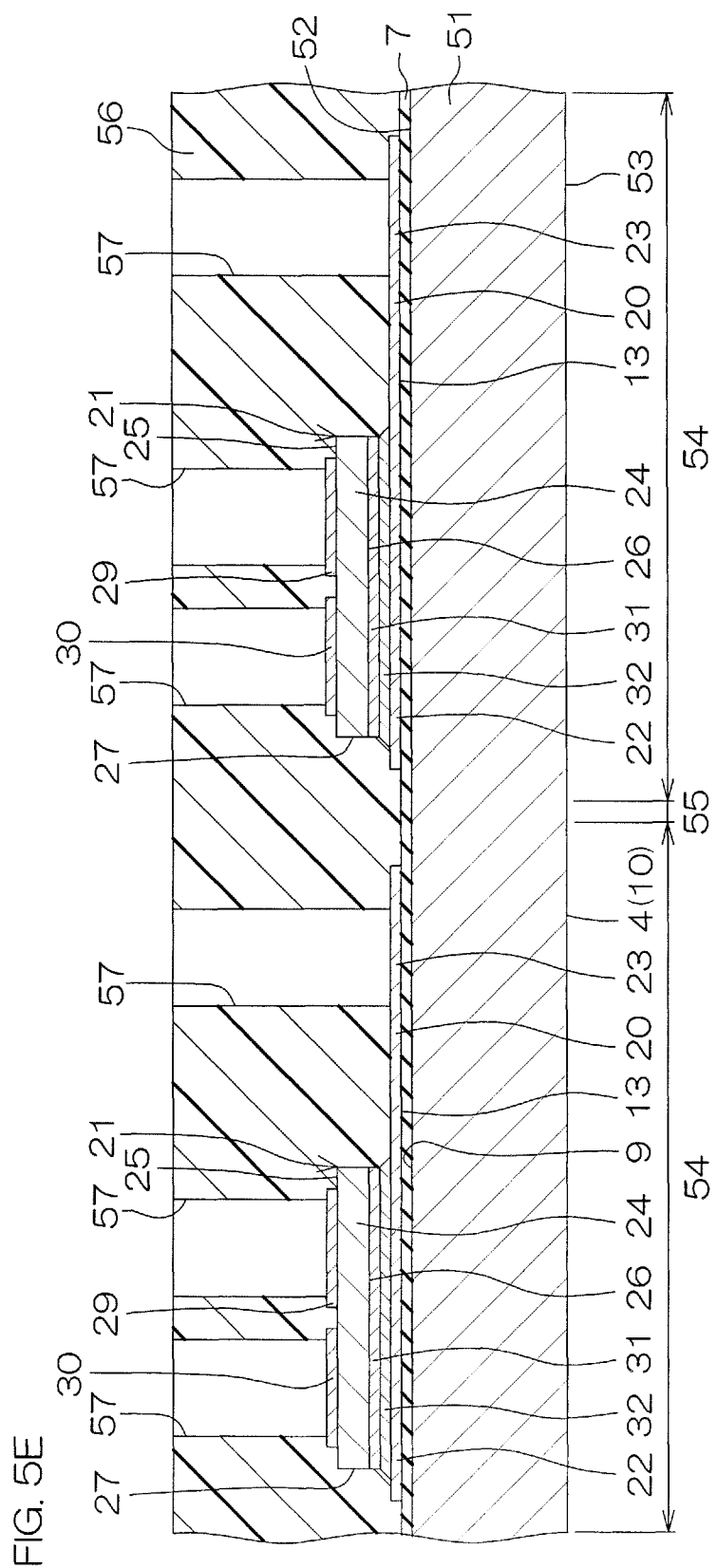
FIG. 5E is a sectional view showing a process after FIG. 5D.

Next, with reference to FIG. 5E, a resist mask 56 having a predetermined pattern is formed on the main surface insulation layer 7. The resist mask 56 has a plurality of openings 57. In the resist mask 56, the plurality of openings 57 respectively expose regions where the gate pillar-shaped electrode layers 40, the source pillar-shaped electrode layers 42, the source sense pillar-shaped electrode layers 44, and the drain pillar-shaped electrode layers 46 are to be formed.

Next, with reference to FIG. 5F, the gate pillar-shaped electrode layers 40, the source pillar-shaped electrode layers 42, the source sense pillar-shaped electrode layers 44, and the drain pillar-shaped electrode layers 46 are formed in the plurality of openings 57. The gate pillar-shaped electrode layers 40, the source pillar-shaped electrode layers 42, the source sense pillar-shaped electrode layers 44, and the drain pillar-shaped electrode layers 46 may be formed by an electrolytic copper plating method via the plurality of openings 57 of the resist mask 56.

Figure 5G:
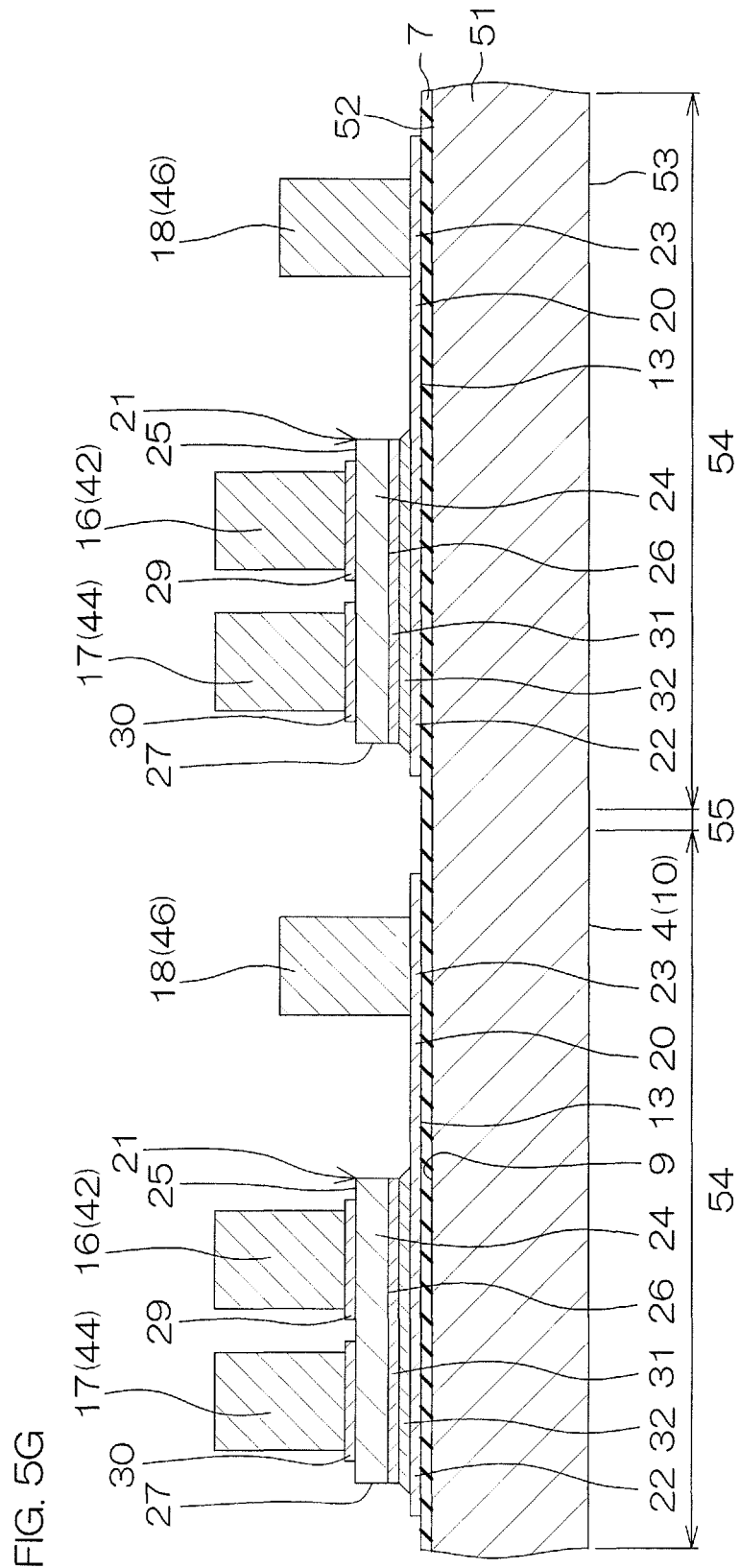
FIG. 5G is a sectional view showing a process after FIG. 5F.

Next, with reference to FIG. 5G, the resist mask 56 is removed. Thereby, the gate pillar-shaped electrode layers 40, the source pillar-shaped electrode layers 42, the source sense pillar-shaped electrode layers 44, and the drain pillar-shaped electrode layers 46 remain in a standing state.

The gate pillar-shaped electrode layers 40, the source pillar-shaped electrode layers 42, the source sense pillar-shaped electrode layers 44, and the drain pillar-shaped electrode layers 46 may be formed by utilizing a burning process instead of the electrolytic copper plating method via the resist mask 56.

In the burning process, first, conductive paste serving as a base of the pillar-shaped electrode layers is applied onto the main surface insulation layer 7. The conductive paste may be copper paste. Next, an unnecessary part of the conductive paste is removed with a pattern corresponding to the gate pillar-shaped electrode layers 40, the source pillar-shaped electrode layers 42, the source sense pillar-shaped electrode layers 44, and the drain pillar-shaped electrode layers 46.

The conductive paste is burnt thereafter. Thereby, the gate pillar-shaped electrode layers 40, the source pillar-shaped electrode layers 42, the source sense pillar-shaped electrode layers 44, and the drain pillar-shaped electrode layers 46 are formed.

Next, with reference to FIG. 5H, sealing resin 58 serving as a base of the sealing insulation layer 8 is applied onto the main surface insulation layer 7. The sealing resin 58 may include epoxy resin or polyimide resin.

The sealing resin 58 collectively seals the wiring layers 20, the MISFET chips 21, the gate pillar-shaped electrode layers 40, the source pillar-shaped electrode layers 42, the source sense pillar-shaped electrode layers 44, and the drain pillar-shaped electrode layers 46 on the main surface insulation layer 7.

The sealing insulation layer 8 may be made of silicon oxide or silicon nitride. In this case, silicon oxide or silicon nitride may be deposited on the main surface insulation layer 7 by a CVD method.

Figure 5I:
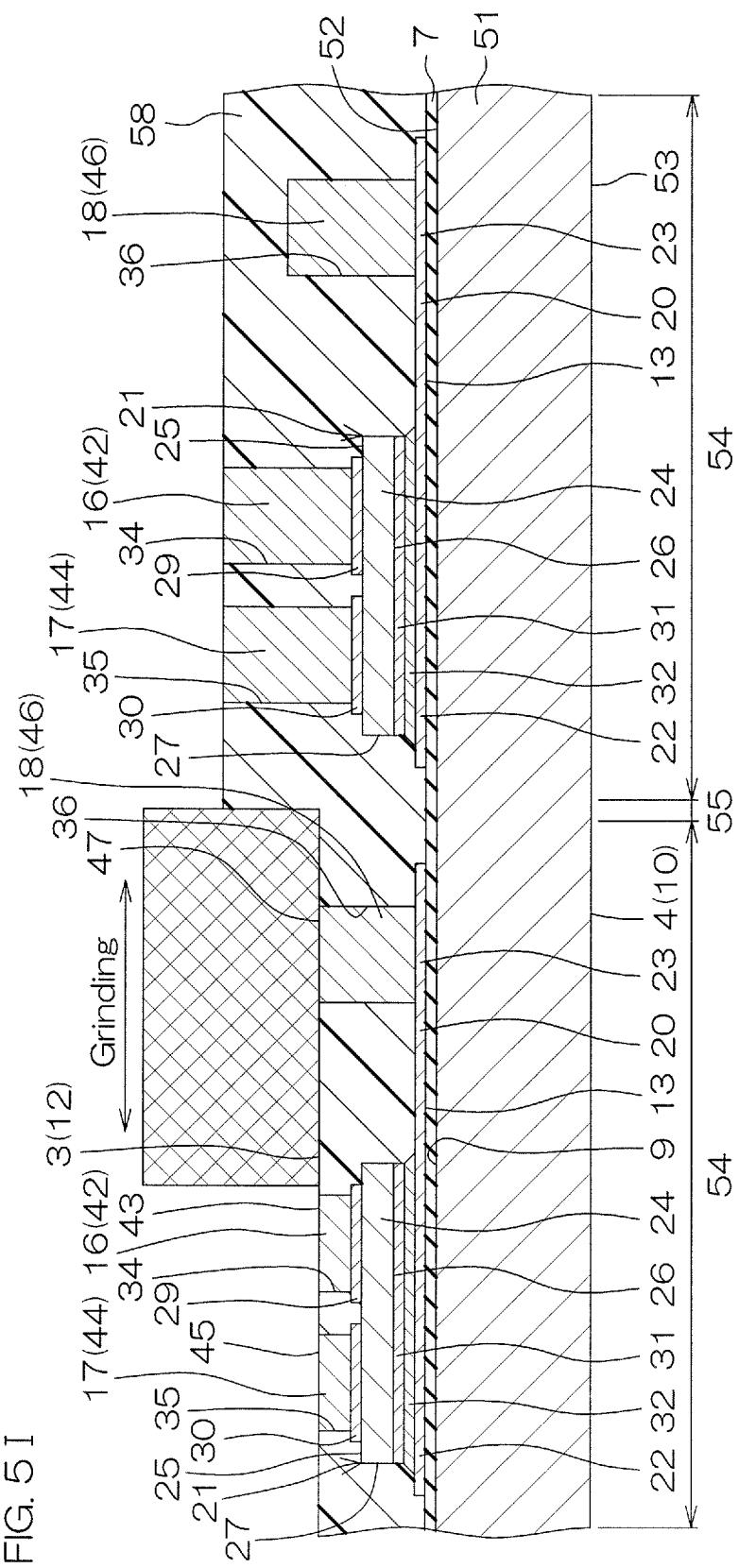
FIG. 5I is a sectional view showing a process after FIG. 5H.

Next, with reference to FIG. 5I, an outer surface of the sealing resin 58 is partly removed from the second chip main surface 26 side of the MISFET chips 21. The outer surface of the sealing resin 58 is removed until the gate pillar-shaped electrode layers 40, the source pillar-shaped electrode layers 42, the source sense pillar-shaped electrode layers 44, and the drain pillar-shaped electrode layers 46 are exposed. A removing process of the sealing resin 58 may be performed by a grinding method.

Thereby, with reference to FIG. 5J, the sealing insulation layer 8 from which the gate pillar-shaped electrode layers 40, the source pillar-shaped electrode layers 42, the source sense pillar-shaped electrode layers 44, and the drain pillar-shaped electrode layers 46 are exposed is formed.

Next, with reference to FIG. 5K, the base substrate 51 is cut along the border region 55. The base substrate 51 may be cut by grinding with a dicing blade. Thereby, the plurality of electronic components 1 are cut out from the single base substrate 51.

The base substrate 51 may be cut by the etching method. The etching method may be a plasma etching method. In this case, the component main body 2 having the side surface 5 that has no grinding mark is formed. After the processes including the above processes, the electronic components 1 are manufactured.

Figure 6:
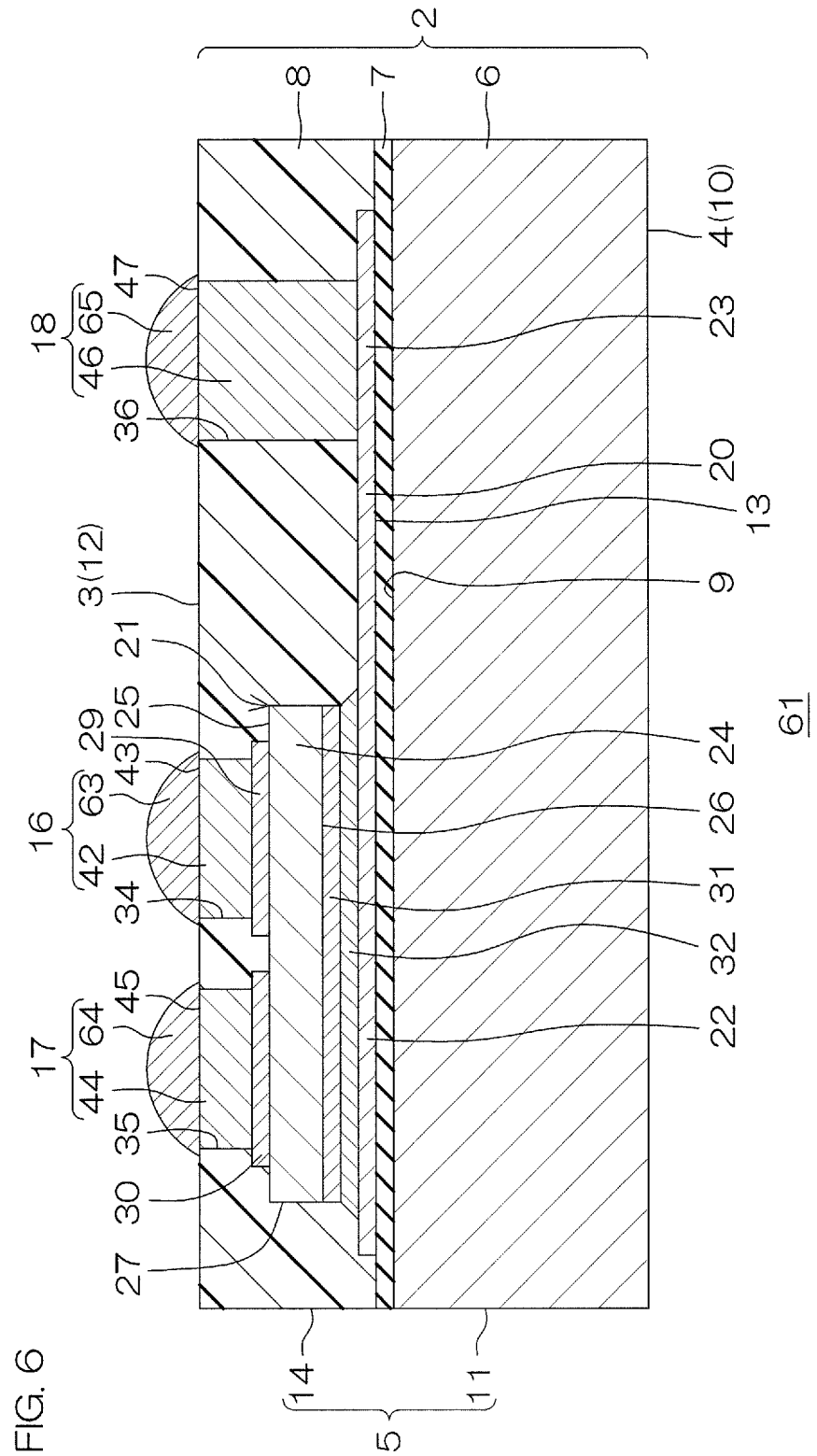
FIG. 6 is a sectional view of a part corresponding to FIG. 3, the view for describing a structure of an electronic component according to a second preferred embodiment of the present invention.
Figure 7:
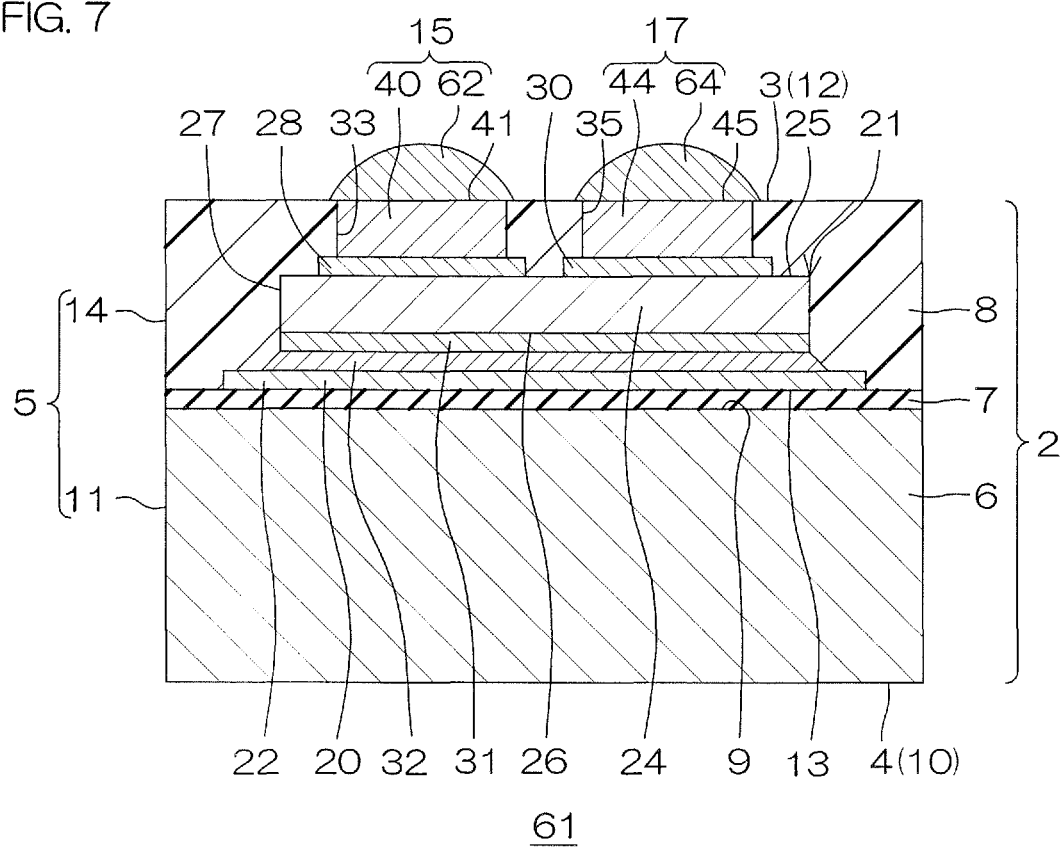
FIG. 7 is a sectional view of apart corresponding to FIG. 4, the view for describing the structure of the electronic component of FIG. 6.

FIG. 6 is a sectional view of a part corresponding to FIG. 3, the view for describing a structure of an electronic component 61 according to a second preferred embodiment of the present invention. FIG. 7 is a sectional view of a part corresponding to FIG. 4, the view for describing the structure of the electronic component 61 of FIG. 6. Hereinafter, structures corresponding to the structures described for the electronic component 1 will be given the same reference signs and description thereof will be omitted.

In this embodiment, a gate external terminal 15 includes a gate conductive bonding layer 62 formed on a gate pillar-shaped electrode layer 40. The gate conductive bonding layer 62 is electrically connected to a gate connection portion 41. The gate conductive bonding layer 62 is formed on the gate connection portion 41.

The gate conductive bonding layer 62 may have a covering portion that covers a first sealing main surface 12 of a sealing insulation layer 8. The entire gate conductive bonding layer 62 is exposed from a gate pad opening 33. The gate conductive bonding layer 62 may include low-melting-point metal. The low-melting-point metal may include a solder. The gate conductive bonding layer 62 may have a projected and curved outer surface.

A source external terminal 16 includes a source conductive bonding layer 63 formed on a source pillar-shaped electrode layer 42. The source conductive bonding layer 63 is electrically connected to a source connection portion 43. The source conductive bonding layer 63 is formed on the source connection portion 43.

The source conductive bonding layer 63 may have a covering portion that covers the first sealing main surface 12 of the sealing insulation layer 8. The entire source conductive bonding layer 63 is exposed from a source pad opening 34. The source conductive bonding layer 63 may include low-melting-point metal. The low-melting-point metal may include a solder. The source conductive bonding layer 63 may have a projected and curved outer surface.

A source sense external terminal 17 includes a source sense conductive bonding layer 64 formed on a source sense pillar-shaped electrode layer 44. The source sense conductive bonding layer 64 is electrically connected to a source sense connection portion 45. The source sense conductive bonding layer 64 is formed on the source sense connection portion 45.

The source sense conductive bonding layer 64 may have a covering portion that covers the first sealing main surface 12 of the sealing insulation layer 8. The entire source sense conductive bonding layer 64 is exposed from a source sense pad opening 35.

The source sense conductive bonding layer 64 may include low-melting-point metal. The low-melting-point metal may include a solder. The source sense conductive bonding layer 64 may have a projected and curved outer surface.

A drain external terminal 18 includes a drain conductive bonding layer 65 formed on a drain pillar-shaped electrode layer 46. The drain conductive bonding layer 65 is electrically connected to a drain connection portion 47. The drain conductive bonding layer 65 is formed on the drain connection portion 47.

The drain conductive bonding layer 65 may have a covering portion that covers the first sealing main surface 12 of the sealing insulation layer 8. The entire drain conductive bonding layer 65 is exposed from a drain pad opening 36. The drain conductive bonding layer 65 may include low-melting-point metal. The low-melting-point metal may include a solder. The drain conductive bonding layer 65 may have a projected and curved outer surface.

The electronic component 61 can be manufactured by further implementing a process of forming the gate conductive bonding layer 62, the source conductive bonding layer 63, the source sense conductive bonding layer 64, and the drain conductive bonding layer 65 in the manufacturing method of the electronic component 1.

The process of forming the conductive bonding layers can be implemented after the process of grinding the sealing resin 58 described above (see FIG. 5J) and prior to the process of cutting the base substrate 51 described above (see FIG. 5K). The conductive bonding layers may be formed by an electrolytic solder plating method.

As described above, also with the electronic component 61, similar effects to the effects described for the electronic component 1 can be exerted.

Figure 8:
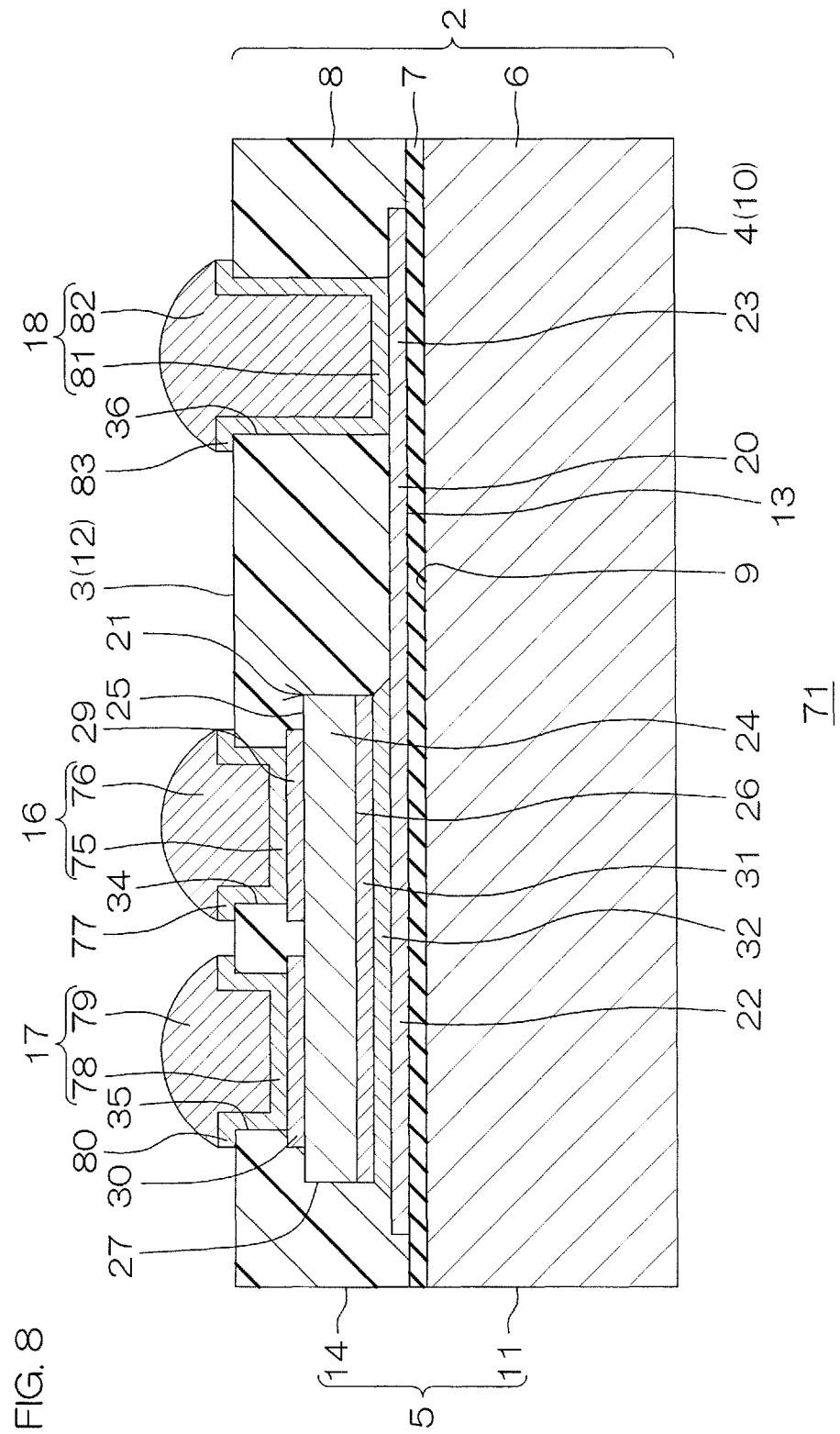
FIG. 8 is a sectional view of a part corresponding to FIG. 3, the view for describing a structure of an electronic component according to a third preferred embodiment of the present invention.
Figure 9:
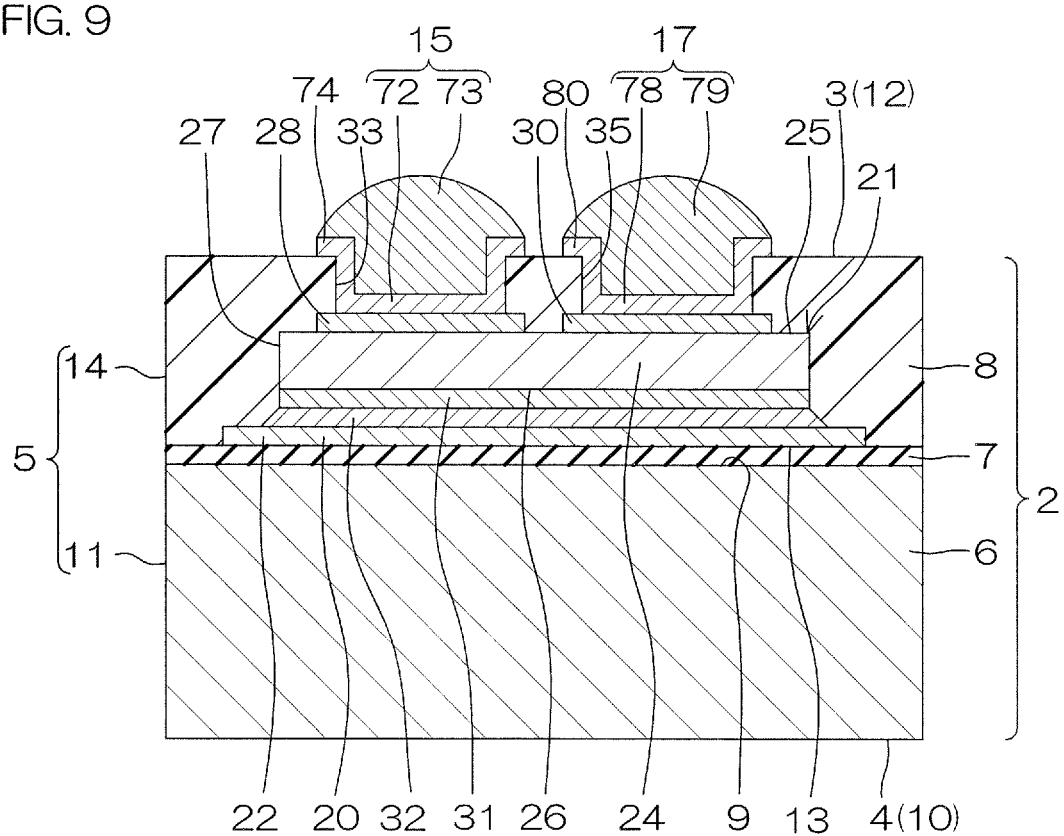
FIG. 9 is a sectional view of apart corresponding to FIG. 4, the view for describing the structure of the electronic component of FIG. 8.

FIG. 8 is a sectional view of a part corresponding to FIG. 3, the view for describing a structure of an electronic component 71 according to a third preferred embodiment of the present invention. FIG. 9 is a sectional view of a part corresponding to FIG. 4, the view for describing the structure of the electronic component 71 of FIG. 8. Hereinafter, structures corresponding to the structures described for the electronic component 1 will be given the same reference signs and description thereof will be omitted.

A gate external terminal 15 includes a gate electrode film 72 and a gate conductive bonding layer 73 in place of the gate pillar-shaped electrode layer 40. The gate electrode film 72 is a foundation layer serving as a foundation of the gate conductive bonding layer 73, and is also called an UBM (under bump metal) layer. The gate electrode film 72 is formed in a film shape along an inner wall of a gate pad opening 33. The gate electrode film 72 defines a recessed space in the gate pad opening 33.

The gate electrode film 72 has a covering portion 74 that covers a first sealing main surface 12 of a sealing insulation layer 8 in a region outside the gate pad opening 33. The gate electrode film 72 may include at least one type of a copper film, a gold film, a titanium film, or a nickel film.

The gate conductive bonding layer 73 is formed on the gate electrode film 72. The gate conductive bonding layer 73 fills the gate pad opening 33. The gate conductive bonding layer 73 projects above the first sealing main surface 12 of the sealing insulation layer 8.

The gate conductive bonding layer 73 covers the covering portion 74 of the gate electrode film 72 in the region outside the gate pad opening 33. The gate conductive bonding layer 62 may include low-melting-point metal. The low-melting-point metal may include a solder. The gate conductive bonding layer 62 may have a projected and curved outer surface.

A source external terminal 16 includes a source electrode film 75 and a source conductive bonding layer 76 in place of the source pillar-shaped electrode layer 42. The source electrode film 75 is a foundation layer serving as a foundation of the source conductive bonding layer 76, and is also called an UBM layer. The source electrode film 75 is formed in a film shape along an inner wall of a source pad opening 34. The source electrode film 75 defines a recessed space in the source pad opening 34.

The source electrode film 75 has a covering portion 77 that covers the first sealing main surface 12 of the sealing insulation layer 8 in a region outside the source pad opening 34. The source electrode film 75 may include at least one type of a copper film, a gold film, a titanium film, or a nickel film.

The source conductive bonding layer 76 is formed on the source electrode film 75. The source conductive bonding layer 76 fills the source pad opening 34, and projects above the first sealing main surface 12 of the sealing insulation layer 8.

The source conductive bonding layer 76 covers the covering portion 77 of the source electrode film 75 in the region outside the source pad opening 34. The source conductive bonding layer 76 may include low-melting-point metal. The low-melting-point metal may include a solder. The source conductive bonding layer 76 may have a projected and curved outer surface.

A source sense external terminal 17 includes a source sense electrode film 78 and a source sense conductive bonding layer 79 in place of the source sense pillar-shaped electrode layer 44. The source sense electrode film 78 is a foundation layer serving as a foundation of the source sense conductive bonding layer 79, and is also called an UBM layer.

The source sense electrode film 78 is formed in a film shape along an inner wall of a source sense pad opening 35. The source sense electrode film 78 defines a recessed space in the source sense pad opening 35.

The source sense electrode film 78 has a covering portion 80 that covers the first sealing main surface 12 of the sealing insulation layer 8 in a region outside the source sense pad opening 35. The source sense electrode film 78 may include at least one type of a copper film, a gold film, a titanium film, or a nickel film.

The source sense conductive bonding layer 79 is formed on the source sense electrode film 78. The source sense conductive bonding layer 79 fills the source sense pad opening 35, and projects above the first sealing main surface 12 of the sealing insulation layer 8.

The source sense conductive bonding layer 79 covers the covering portion 80 of the source sense electrode film 78 in the region outside the source sense pad opening 35. The source sense electrode film 78 may include low-melting-point metal. The low-melting-point metal may include a solder. The source sense electrode film 78 may have a projected and curved outer surface.

A drain external terminal 18 includes a drain electrode film 81 and a drain conductive bonding layer 82 in place of the drain pillar-shaped electrode layer 46 (see FIG. 3). The drain electrode film 81 is a foundation layer serving as a foundation of the drain conductive bonding layer 82, and is also called an UBM layer.

The drain electrode film 81 is formed in a film shape along an inner wall of a drain pad opening 36. The drain electrode film 81 defines a recessed space in the drain pad opening 36.

The drain electrode film 81 has a covering portion 83 that covers the first sealing main surface 12 of the sealing insulation layer 8 in a region outside the drain pad opening 36. The drain electrode film 81 may include at least one type of a copper film, a gold film, a titanium film, or a nickel film.

The drain conductive bonding layer 82 is formed on the drain electrode film 81. The drain conductive bonding layer 82 fills the drain pad opening 36, and projects above the first sealing main surface 12 of the sealing insulation layer 8.

The drain conductive bonding layer 82 covers the covering portion 83 of the drain electrode film 81 in the region outside the drain pad opening 36. The drain conductive bonding layer 82 may include low-melting-point metal. The low-melting-point metal may include a solder. The drain conductive bonding layer 82 may have a projected and curved outer surface.

FIGS. 10A to 10E are sectional views for describing an example of a manufacturing method of the electronic component 71 of FIG. 8. Here, specific description of processes common to the manufacturing processes of the electronic component 1 according to the first preferred embodiment described above will be omitted.

Figure 10A:
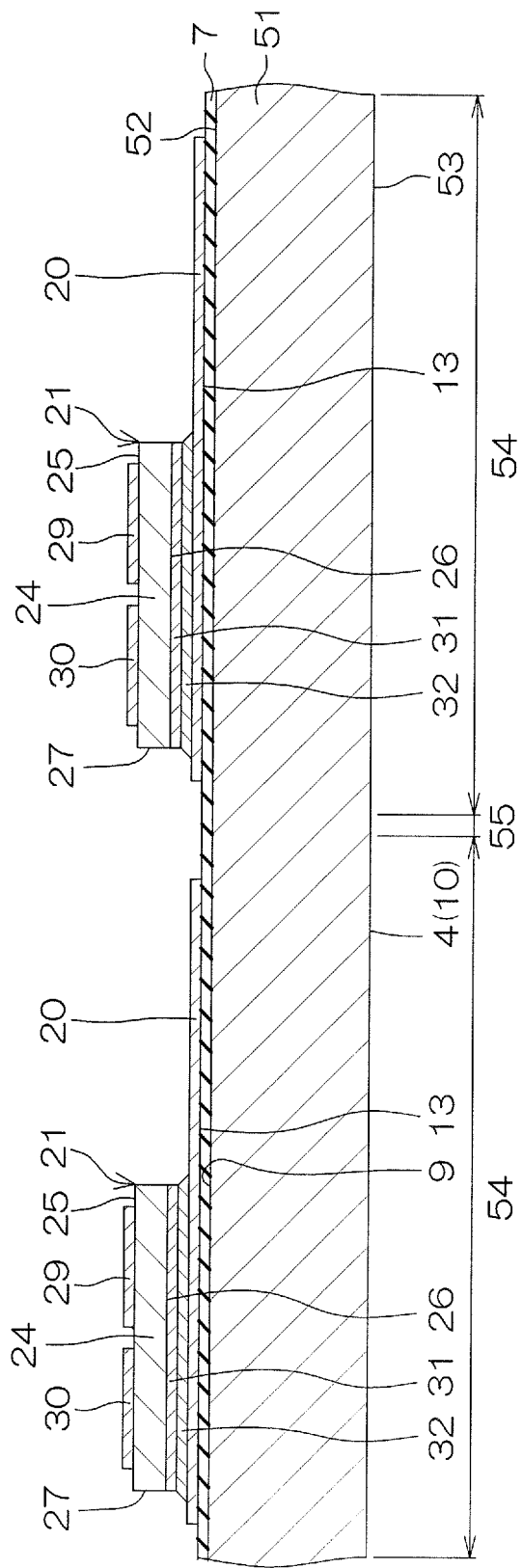
FIG. 10A is a sectional view for describing an example of a manufacturing method of the electronic component of FIG. 8.

First, with reference to FIG. 10A, a base substrate 51 after the process of bonding the MISFET chips 21 is prepared (see FIG. 5D together).

Figure 10B:
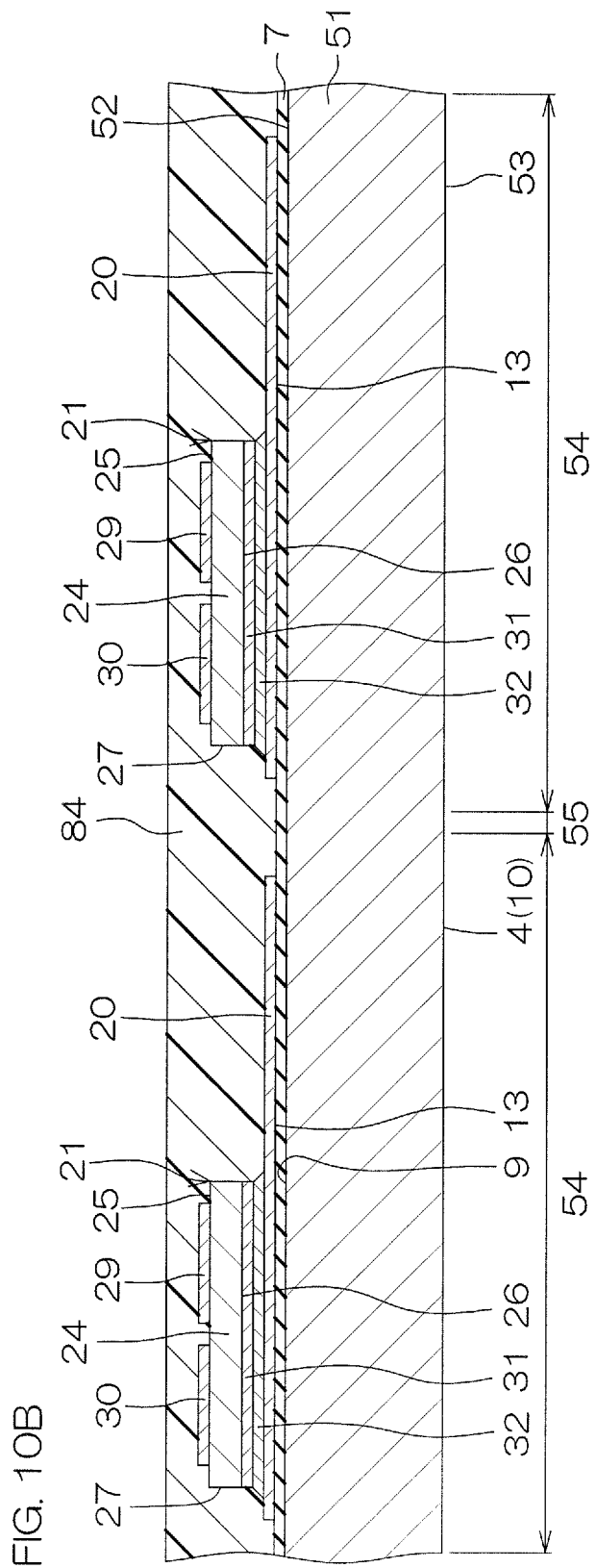
FIG. 10B is a sectional view showing a process after FIG. 10A.

Next, with reference to FIG. 10B, sealing resin 84 serving as a base of the sealing insulation layer 8 is applied onto a main surface insulation layer 7. The sealing resin 84 collectively seals, on the main surface insulation layer 7, the wiring layers 20 and the MISFET chips 21.

Next, with reference to FIG. 10C, the gate pad opening 33, the source pad opening 34, the source sense pad opening 35, and the drain pad opening 36 are formed in the sealing resin 84. In a case where the sealing resin 84 is made of a photoresist, the respective openings may be formed by exposure and development.

The sealing resin 84 may be made of an insulating material such as silicon oxide or silicon nitride. Silicon oxide or silicon nitride may be deposited on the main surface insulation layer 7 by a CVD method. In a case where the sealing resin 84 is made of an insulating material, the respective openings may be formed by an etching method.

Figure 10D:
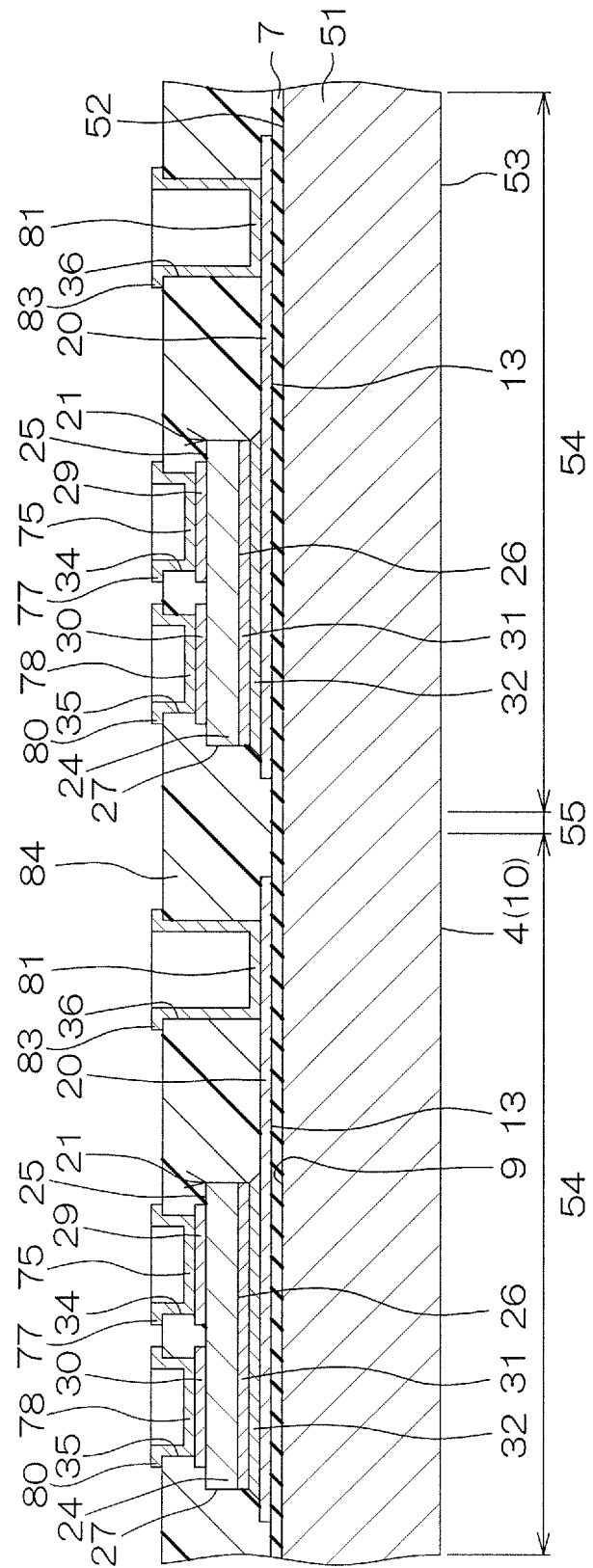
FIG. 10D is a sectional view showing a process after FIG. 10C.

Next, with reference to FIG. 10D, the gate electrode film 72, the source electrode film 75, the source sense electrode film 78, and the drain electrode film 81 are formed. In this process, first, a conductive material layer is formed by the sputtering method and/or an electrolytic plating method.

Next, the conductive material layer is selectively removed by the etching method via a resist mask (not shown). Thereby, the gate electrode film 72, the source electrode film 75, the source sense electrode film 78, and the drain electrode film 81 are formed.

Figure 10E:
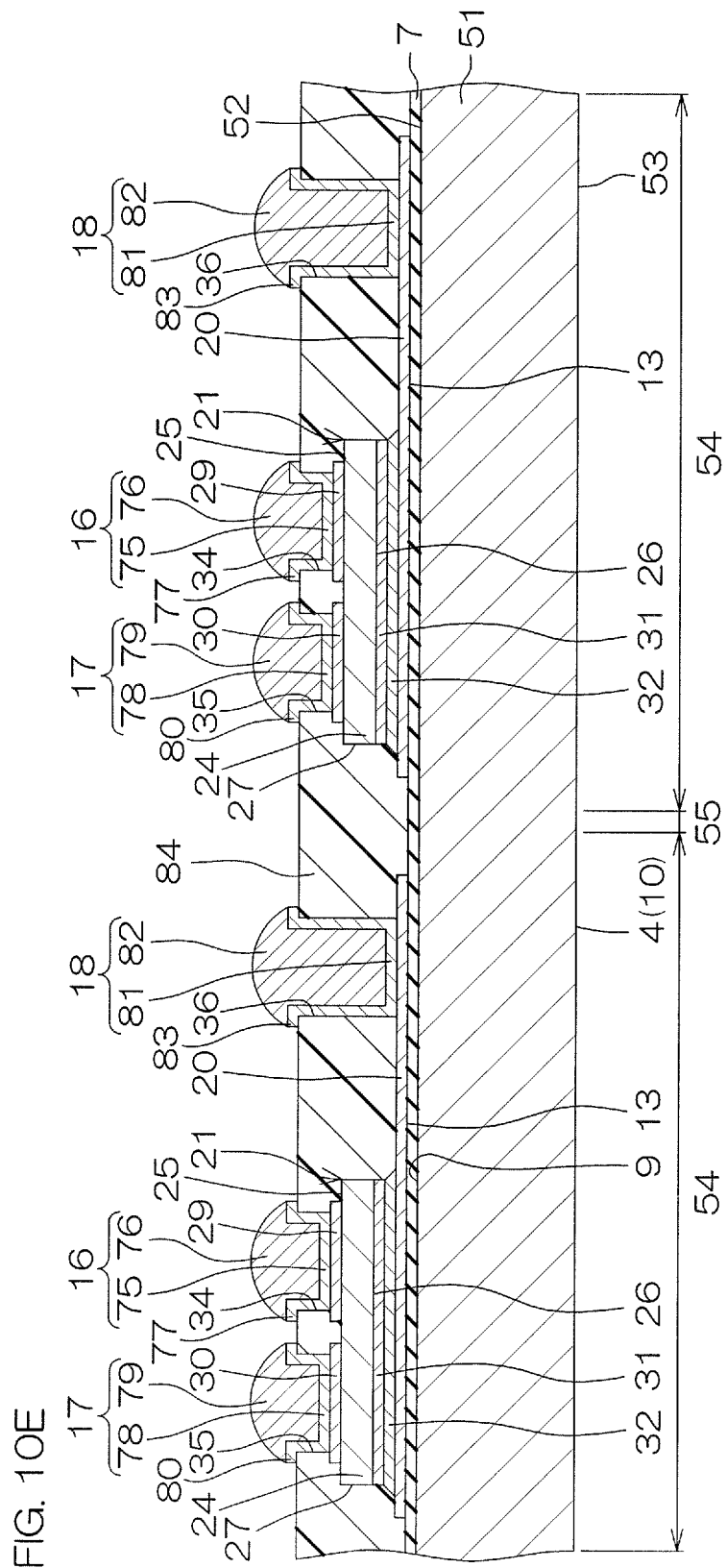
FIG. 10E is a sectional view showing a process after FIG. 10D.

Next, with reference to FIG. 10E, the gate conductive bonding layer 62, the source conductive bonding layer 76, the source sense conductive bonding layer 79, and the drain conductive bonding layer 82 are formed. The respective conductive bonding layers may be formed by the electrolytic solder plating method.

The base substrate 51 is cut along a border region 55 (see FIG. 5K together) thereafter. Thereby, the plurality of electronic components 71 are cut out from the single base substrate 51. After the above processes, the electronic components 71 are manufactured.

As described above, also with the electronic component 71, similar effects to the effects described for the electronic component 1 can be exerted.

Figure 11:
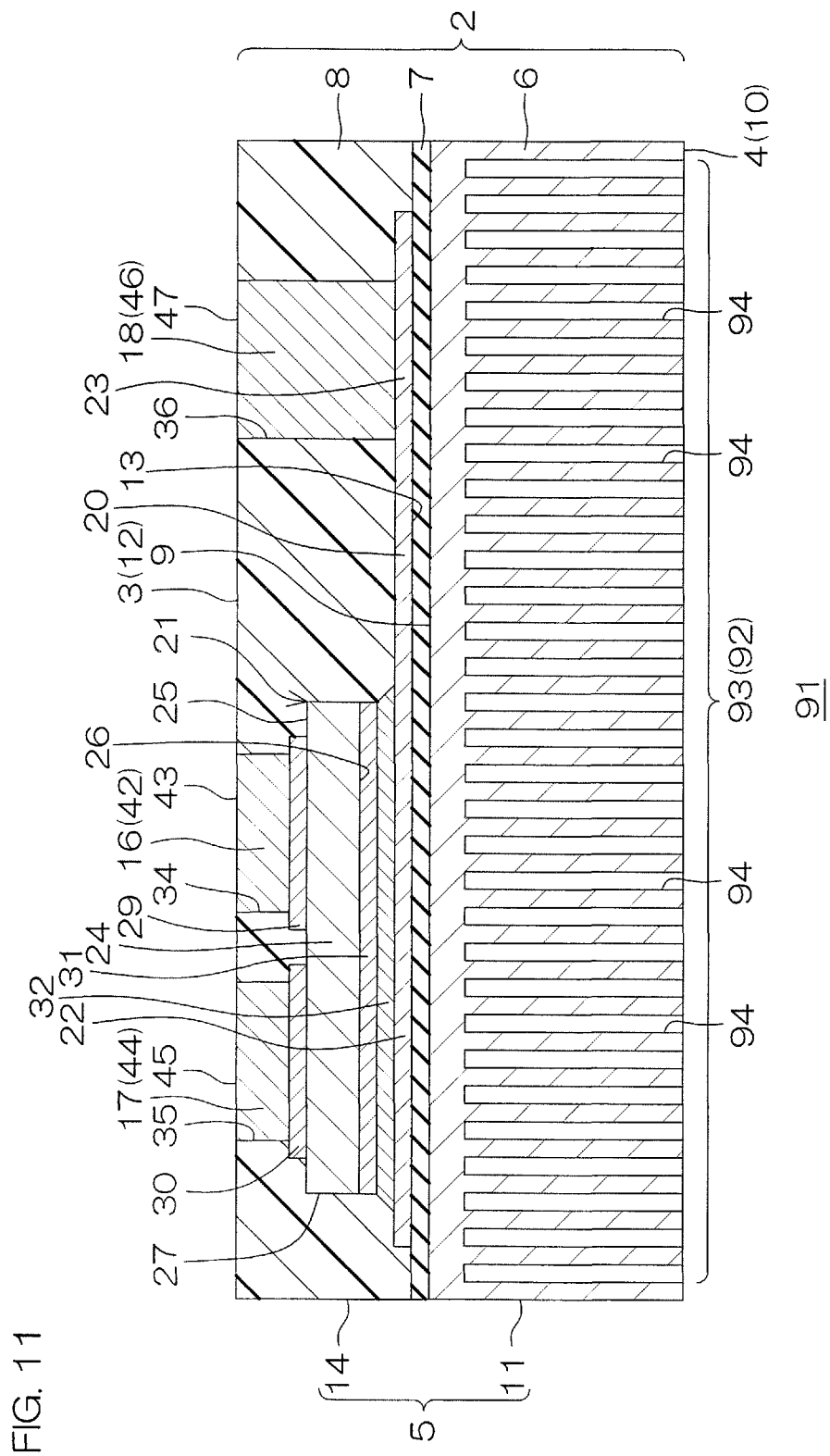
FIG. 11 is a sectional view of a part corresponding to FIG. 3, the view for describing a structure of an electronic component according to a fourth preferred embodiment of the present invention.

FIG. 11 is a sectional view of a part corresponding to FIG. 3, the view for describing a structure of an electronic component 91 according to a fourth preferred embodiment of the present invention. Hereinafter, structures corresponding to the structures described for the electronic component 1 will be given the same reference signs and description thereof will be omitted.

The electronic component 91 includes a heat dissipation structure 92 that dissipates heat generated in a MISFET chip 21 to the outside. The heat dissipation structure 92 is provided in a second substrate main surface 10 of a substrate 6.

In this embodiment, the heat dissipation structure 92 includes a fin structure 93 formed in the second substrate main surface 10 of the substrate 6. The fin structure 93 includes a single or a plurality of trenches 94 dug from the second substrate main surface 10 of the substrate 6 toward a first substrate main surface 9 in the second substrate main surface 10 of the substrate 6. Depth of each trench may be not less than 1 μm and not more than 500 μm.

In a case where the fin structure 93 includes a single trench 94, the single trench 94 may be formed in a grid shape, a zigzag shape, a comb-teeth shape, or a spiral shape in the plan view. In a case where the fin structure 93 includes a plurality of trenches 94, the plurality of trenches 94 may be formed in a stripe form or a dotted form in the plan view. A single or a plurality of trenches 94 in which these various planar shapes are combined may be formed.

FIGS. 12A to 12C are sectional views for describing an example of a manufacturing method of the electronic component 91 of FIG. 11. Here, specific description of processes common to the manufacturing processes of the electronic component 1 according to the first preferred embodiment described above will be omitted.

A process of forming the fin structure 93 can be implemented at an arbitrary timing prior to the process of cutting the base substrate 51 described above (see FIG. 5K). Hereinafter, an example in which the process of forming the fin structure 93 is implemented after the process of preparing the base substrate 51 (see FIG. 5A) and prior to the process of forming the main surface insulation layer 7 (see FIG. 5B) will be described.

With reference to FIG. 12A, a resist mask 95 having a predetermined pattern is formed on a second substrate main surface 53 of the base substrate 51 after a base substrate 51 is prepared. The resist mask 95 has openings 96 from which regions where the trenches 94 are to be formed are selectively exposed.

Next, with reference to FIG. 12B, an unnecessary part of the base substrate 51 is removed by an etching method via the resist mask 95. Thereby, the fin structure 93 including the single or the plurality of trenches 94 is formed in the second substrate main surface 53 of the base substrate 51.

Next, with reference to FIG. 12C, the resist mask 95 is removed. After that, the processes of FIGS. 5B to 5K are executed in order, and the electronic components 91 are manufactured.

As described above, also with the electronic component 91, similar effects to the effects described for the electronic component 1 can be exerted.

With the electronic component 91, the heat dissipation structure 92 including the fin structure 93 is formed in the second substrate main surface 10 of the substrate 6. With the fin structure 93, a surface area of the substrate 6 can be increased. Thereby, heat transmitted from the MISFET chip 21 to the substrate 6 can be efficiently dissipated to the outside.

With the electronic component 91, the fin structure 93 can be formed by utilizing some regions of the substrate 6. Thereby, it is unnecessary to attach a heat dissipator such as a metal heat sink to the second substrate main surface 10 of the substrate 6. Therefore, thickening of a component main body 2 along the normal direction of a mounting surface 3 and a non-mounting surface 4 can be suppressed. Thus, the heat dissipation can be improved while downsizing the electronic component 91.

The heat dissipation structure 92 may include a metal film serving as a heat dissipation member in addition to the fin structure 93. The metal film may be formed along the second substrate main surface 10 of the substrate 6 and inner walls of the trenches 94.

The metal film may cover the entire second substrate main surface 10 and entirely fill the inside of the trenches 94. The metal film may include a copper film, a gold film, a silver film, a nickel film, a titanium film, and an aluminum film, etc.

The metal film may be formed by a sputtering method and/or a plating method. A process of forming the metal film can be implemented at an arbitrary timing after the process of removing the resist mask 95 described above (see FIG. 12C together). With the heat dissipation structure 92 of such a structure, the heat dissipation of the substrate 6 can be furthermore enhanced.

The structure of the second preferred embodiment or the structure of the third preferred embodiment, or an arrangement in which the structure of the second preferred embodiment and the structure of the third preferred embodiment are combined may be applied to the electronic component 91.

FIG. 13 is a sectional view of a part corresponding to FIG. 3, the view for describing a structure of an electronic component 101 according to a fifth preferred embodiment of the present invention. Hereinafter, structures corresponding to the structures described for the electronic component 1 will be given the same reference signs and description thereof will be omitted.

The electronic component 101 includes a heat dissipation structure 102 that dissipates heat generated in a MISFET chip 21 to the outside. The heat dissipation structure 102 is provided in a second substrate main surface 10 of a substrate 6. In this embodiment, the heat dissipation structure 102 includes a heat dissipation member 103 that covers the second substrate main surface 10 of the substrate 6.

The heat dissipation member 103 may be a heat dissipation plate connected to the second substrate main surface 10 of the substrate 6. The heat dissipation plate may be a metal plate. The metal plate may include a copper plate, a gold plate, a nickel plate, a titanium plate, and an aluminum plate, etc.

The heat dissipation member 103 may be a metal film formed by a sputtering method and/or a plating method in place of the heat dissipation plate. The metal film may include a copper film, a gold film, a silver film, a nickel film, a titanium film, and an aluminum film, etc. A process of forming the heat dissipation member 103 can be implemented prior to the process of cutting the base substrate 51 described above (see FIG. 5K together).

As described above, also with the electronic component 101, similar effects to the effects described for the electronic component 1 can be exerted.

With the electronic component 101, the heat dissipation structure 102 including the heat dissipation member 103 is formed in the second substrate main surface 10 of the substrate 6. Thereby, heat transmitted from the MISFET chip 21 to the substrate 6 can be efficiently dissipated to the outside.

In particular, with the heat dissipation member 103 including the metal film, thickening of a component main body 2 along the normal direction of a mounting surface 3 and a non-mounting surface 4 can be suppressed. Thus, the heat dissipation can be improved while downsizing the electronic component 101.

The structure of the second preferred embodiment, the structure of the third preferred embodiment, or the structure of the fourth preferred embodiment, or an arrangement in which arbitrary two or three arrangements among the structures of the second to fourth preferred embodiments are combined may be applied to the electronic component 101.

Figure 14:
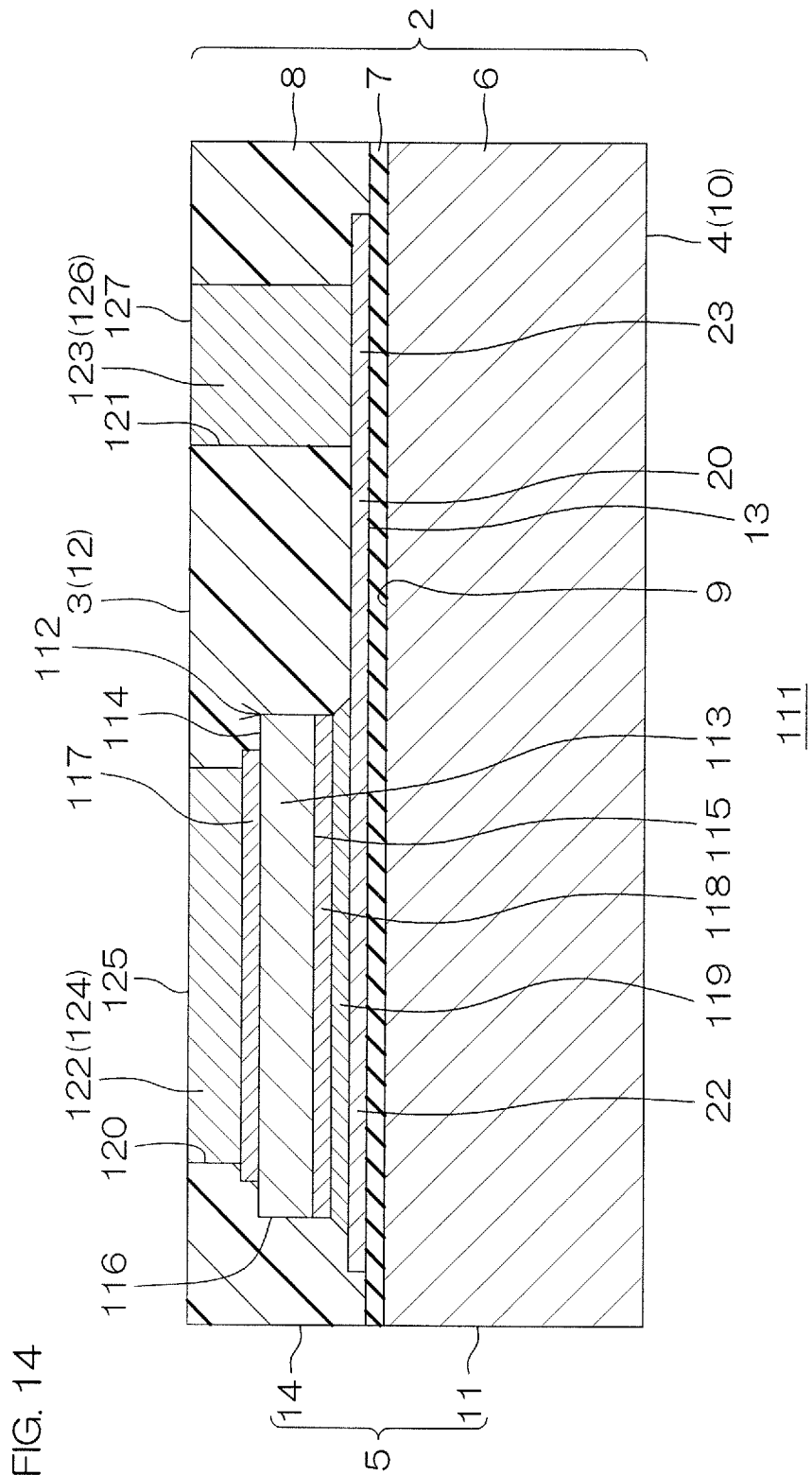
FIG. 14 is a view for describing a structure of an electronic component according to a sixth preferred embodiment of the present invention.

FIG. 14 is a view for describing a structure of an electronic component 111 according to a sixth preferred embodiment of the present invention. Hereinafter, structures corresponding to the structures described for the electronic component 1 will be given the same reference signs and description thereof will be omitted.

The electronic component 111 is a semiconductor device including a diode that serves as an example of a semiconductor rectifier device. Various diodes such as a p-n junction diode, a fast recovery diode, a Zener diode, and a Schottky barrier diode, etc., may be adopted as the diode. In the present preferred embodiment, the Schottky barrier diode is adopted as the diode.

The electronic component 111 includes a diode chip 112 in place of the MISFET chip 21. The diode chip 112 includes a chip main body 113 formed in a rectangular parallelepiped. The chip main body 113 includes a first chip main surface 114 on one side, a second chip main surface 115 on the other side, and a chip side surface 116 connecting the first chip main surface 114 and the second chip main surface 115.

The diode chip 112 may be a Si-diode chip having a chip main body 113 that includes Si. A withstand voltage of the Si-diode chip may be not less than 30 V and not more than 6,500 V. The withstand voltage of the Si-diode chip is defined by maximum reverse voltage VR applicable between an anode and a cathode.

The diode chip 112 may be a diode chip having a chip main body 113 that includes a compound semiconductor. The chip main body 113 may include a nitride semiconductor or an oxide semiconductor as the compound semiconductor.

The nitride semiconductor may include gallium nitride (GaN). The oxide semiconductor may include gallium oxide ($Ga_2O_3$). A withstand voltage of the diode chip including the compound semiconductor may be not less than 600 V and not more than 10,000 V.

The diode chip 112 may be a SiC-diode chip having a chip main body 113 that includes SiC. A withstand voltage of the SiC-diode chip may be not less than 600 V and not more than 15,000 V.

Especially, with the diode chip including the compound semiconductor and the SiC-diode chip, a temperature may become high by heat generation due to a large current. The electronic component 111 has a structure beneficial for these high-power type diode chips.

The diode chip 112 includes a cathode terminal electrode layer 117 and an anode terminal electrode layer 118. The cathode terminal electrode layer 117 is formed on the first chip main surface 114 of the chip main body 113. The anode terminal electrode layer 118 is formed on the second chip main surface 115 of the chip main body 113.

The diode chip 112 is arranged on a first substrate main surface 9 of a substrate 6 in a posture that the second chip main surface 115 of the chip main body 113 opposes the first substrate main surface 9 of the substrate 6. The anode terminal electrode layer 118 is bonded to a first connection region 22 of a wiring layer 20 via a conductive bonding material 119. That is, the wiring layer 20 forms an anode wiring layer.

The conductive bonding material 119 may include low-melting-point metal or metal paste. The low-melting-point metal may include a solder. The metal paste may include copper paste, silver paste, and gold paste, etc.

Arrangement, a shape, size, etc., of the cathode terminal electrode layer 117 and the anode terminal electrode layer 118 are not limited to particular modes. For the arrangement, the shape, the size, etc., of the cathode terminal electrode layer 117 and the anode terminal electrode layer 118, various modes may be adopted based on the specifications of the diode chip 112.

The cathode terminal electrode layer 117 may include an island-shaped pad portion formed on the first chip main surface 114, and a linear line portion selectively drawn from the pad portion onto the first chip main surface 114.

The anode terminal electrode layer 118 may include an island-shaped pad portion formed on the first chip main surface 114, and a linear line portion selectively drawn from the pad portion onto the second chip main surface 115.

The diode chip 112 may include a multilayer wiring structure formed on the first chip main surface 114 and/or the second chip main surface 115 of the chip main body 113. The multilayer wiring structure may have a structure in which a wiring layer and an insulation layer are alternately laminated.

In a case where the multilayer wiring structure is formed on the first chip main surface 114, the cathode terminal electrode layer 117 may be formed as an uppermost wiring layer in the multilayer wiring structure. In a case where the multilayer wiring structure is formed on the second chip main surface 115, the anode terminal electrode layer 118 may be formed as an uppermost wiring layer in the multilayer wiring structure.

The diode chip 112 may include a plurality of (two or more) cathode terminal electrode layers 117. The diode chip 112 may include a plurality of (two or more) anode terminal electrode layers 118.

In the sealing insulation layer 8, a cathode pad opening 120 and an anode pad opening 121 are formed. The cathode pad opening 120 selectively exposes the cathode terminal electrode layer 117 of the diode chip 112. The anode pad opening 121 selectively exposes a second connection region 23 of the wiring layer 20.

The electronic component 111 includes a cathode external terminal 122 and an anode external terminal 123. The cathode external terminal 122 is formed as a chip side external terminal. The anode external terminal 123 is formed as a wiring layer side external terminal.

The cathode external terminal 122 is embedded in the cathode pad opening 120. The cathode external terminal 122 is connected to the cathode terminal electrode layer 117 in the cathode pad opening 120.

The cathode external terminal 122 includes a cathode pillar-shaped electrode layer 124 of a pillar shape standing along the normal direction of the first chip main surface 114 of the chip main body 113. The cathode pillar-shaped electrode layer 124 includes a cathode connection portion 125 to be externally connected.

The cathode connection portion 125 is exposed from a first sealing main surface 12 of the sealing insulation layer 8. The cathode connection portion 125 has a connection surface which is flush with the first sealing main surface 12 of the sealing insulation layer 8. The cathode pillar-shaped electrode layer 124 may include copper.

The anode external terminal 123 is embedded in the anode pad opening 121. The anode external terminal 123 is connected to the second connection region 23 of the wiring layer 20 in the anode pad opening 121. The anode external terminal 123 is electrically connected to the anode terminal electrode layer 118 of the diode chip 112 via the wiring layer 20.

The anode external terminal 123 includes an anode pillar-shaped electrode layer 126 of a pillar shape standing along the normal direction of the first substrate main surface 9 of the substrate 6. The anode pillar-shaped electrode layer 126 includes an anode connection portion 127 connected to the outside.

The anode connection portion 127 is exposed from the first sealing main surface 12 of the sealing insulation layer 8. The anode connection portion 127 has a connection surface which is flush with the first sealing main surface 12 of the sealing insulation layer 8. The anode pillar-shaped electrode layer 126 may include copper.

The electronic component 111 can be manufactured through substantially similar processes to the manufacturing method of the electronic component 1 described above. As described above, also with the electronic component 111 including the diode chip 112 in place of the MISFET chip 21, similar effects to the effects described for the electronic component 1 can be exerted.

The diode chip 112 may be arranged on the first substrate main surface 9 of the substrate 6 in a posture that the first chip main surface 114 of the chip main body 113 opposes the first substrate main surface 9 of the substrate 6. That is, a structure in which the connection mode of the anode and the connection mode of the cathode are switched may be adopted. In this case, the cathode terminal electrode layer 117 is bonded to the first connection region 22 of the wiring layer 20 via the conductive bonding material 119. That is, the wiring layer 20 forms a cathode wiring layer.

The structure of the second preferred embodiment, the structure of the third preferred embodiment, the structure of the fourth preferred embodiment, or the structure of the fifth preferred embodiment, or an arrangement in which arbitrary two, three, or four structures among the second to fifth preferred embodiments are combined may be applied to the electronic component 111.

Figure 15:
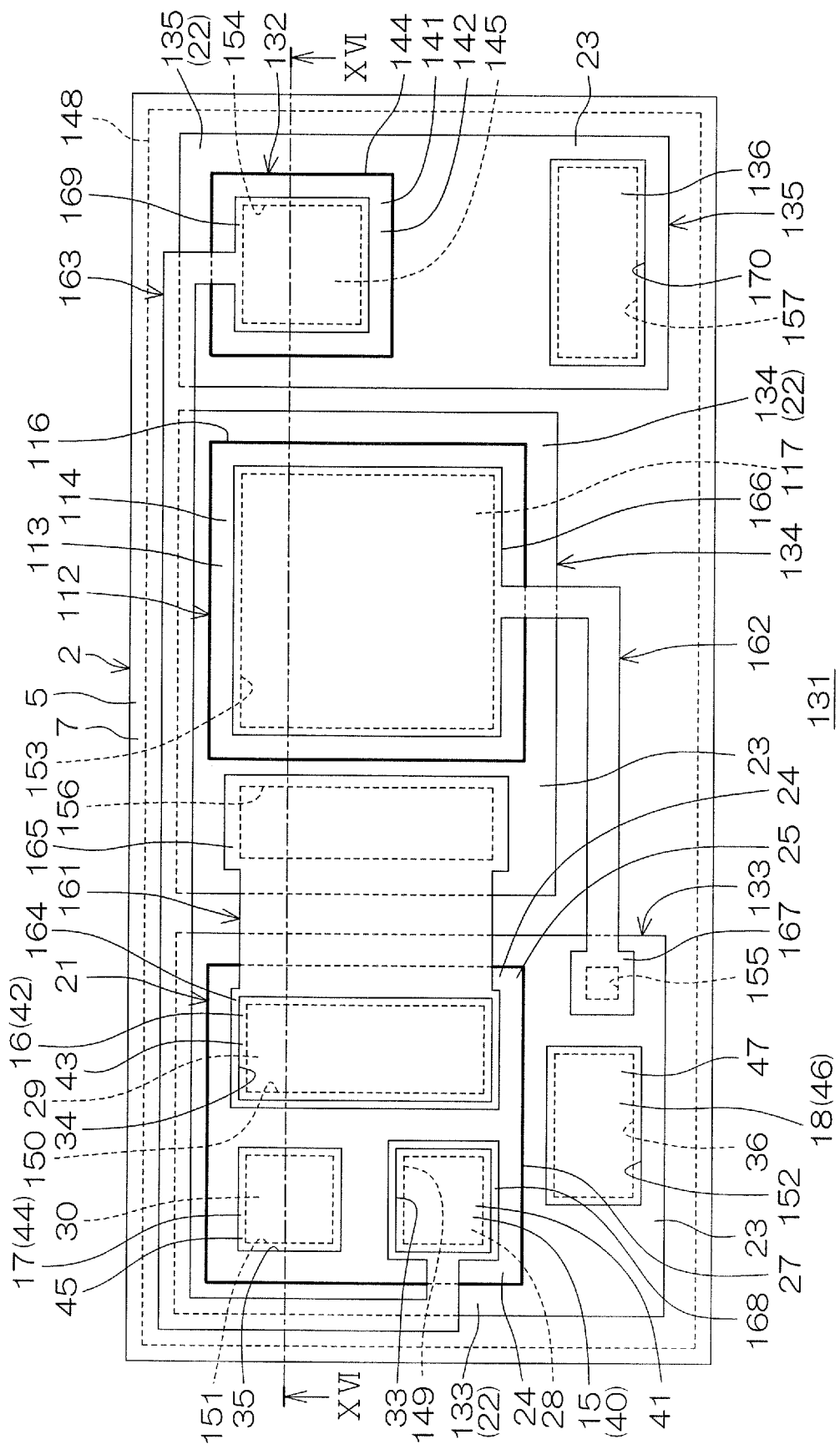
FIG. 15 is a plan view for describing an internal structure of an electronic component according to a seventh preferred embodiment of the present invention.
Figure 16:
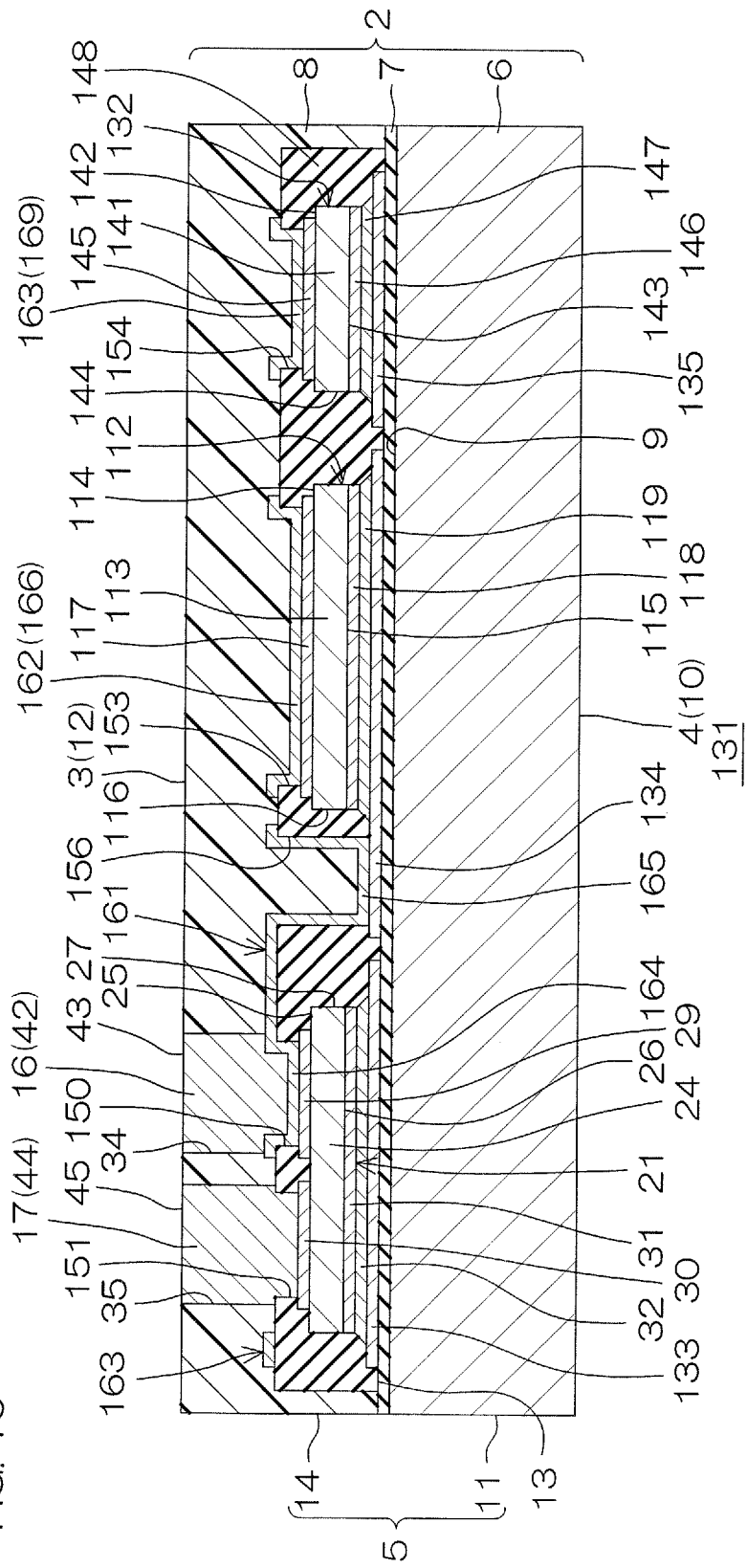
FIG. 16 is a sectional view taken along line XVI-XVI of FIG. 15.

FIG. 15 is the plan view for describing an internal structure of an electronic component 131 according to a seventh preferred embodiment of the present invention. FIG. 16 is a sectional view taken along line XVI-XVI of FIG. 15. Hereinafter, structures corresponding to the structures described for the electronic component 1 will be given the same reference signs and description thereof will be omitted.

With reference to FIGS. 15 and 16, the electronic component 131 is a semiconductor power module including a plurality of chips. The electronic component 131 includes a diode chip 112 and an IC chip 132 (control chip) in addition to a MISFET chip 21. Arrangement positions of the MISFET chip 21, the diode chip 112, and the IC chip 132 with respect to a first substrate main surface 9 of a substrate 6 are arbitrary and not limited to particular arrangement positions.

The electronic component 131 includes a first wiring layer 133 for the MISFET chip 21, a second wiring layer 134 for the diode chip 112, and a third wiring layer 135 for the IC chip 132. The first wiring layer 133, the second wiring layer 134, and the third wiring layer 135 have a similar structure to the wiring layer 20 described above.

The MISFET chip 21 and a drain external terminal 18 are connected to the first wiring layer 133. A mode of connecting the MISFET chip 21 and the drain external terminal 18 to the first wiring layer 133 is similar to the case of the electronic component 1 described above.

The diode chip 112 is connected to the second wiring layer 134. A mode of connecting the diode chip 112 to the second wiring layer 134 is similar to the case of the electronic component 111 described above. However, in this embodiment, no cathode external terminal 122 and no anode external terminal 123 are provided.

An input external terminal 136 and the IC chip 132 are connected to the third wiring layer 135. The input external terminal 136 is formed as a wiring layer side external terminal. The input external terminal 136 is a terminal for supplying electric power to the IC chip 132. The input external terminal 136 is electrically connected to the IC chip 132 via the third wiring layer 135.

An arrangement of the input external terminal 136 is substantially similar to the arrangement of the drain external terminal 18. A mode of connecting the input external terminal 136 to the third wiring layer 135 is similar to the mode of connecting the drain external terminal 18 to the first wiring layer 133.

In this embodiment, the IC chip 132 is a gate driver IC for driving and controlling a gate of the MISFET chip 21. The IC chip 132 includes a chip main body 141 formed in a rectangular parallelepiped. The chip main body 141 includes a first chip main surface 142 on one side, a second chip main surface 143 on the other side, and a chip side surface 144 connecting the first chip main surface 142 and the second chip main surface 143.

The IC chip 132 includes an output terminal electrode layer 145 and an input terminal electrode layer 146. The output terminal electrode layer 145 is formed on the first chip main surface 142 of the chip main body 141. The input terminal electrode layer 146 is formed on the second chip main surface 143 of the chip main body 141.

The input terminal electrode layer 146 is bonded to the third wiring layer 135 via a conductive bonding material 147. Thereby, the IC chip 132 is electrically connected to the input external terminal 136 via the third wiring layer 135.

The conductive bonding material 147 may include low-melting-point metal or metal paste. The low-melting-point metal may include a solder. The metal paste may include copper paste, silver paste, and gold paste, etc.

Arrangement, a shape, size, etc., of the output terminal electrode layer 145 and the input terminal electrode layer 146 are not limited to particular modes. For the arrangement, the shape, the size, etc., of the output terminal electrode layer 145 and the input terminal electrode layer 146, various modes may be adopted based on the specifications of the IC chip 132.

A plurality of output terminal electrode layers 145 may be formed on the first chip main surface 142 of the chip main body 141. The single or the plurality of output terminal electrode layers 145 may include an island-shaped pad portion, and a linear line portion selectively drawn from the pad portion onto the first chip main surface 142.

The IC chip 132 may include a multilayer wiring structure formed on the first chip main surface 142 and/or the second chip main surface 143 of the chip main body 141. The multilayer wiring structure may have a structure in which a wiring layer and an insulation layer are alternately laminated.

In a case where the multilayer wiring structure is formed on the first chip main surface 142, the output terminal electrode layer 145 may be formed as an uppermost wiring layer in the multilayer wiring structure. In a case where the multilayer wiring structure is formed on the second chip main surface 143, the input terminal electrode layer 146 may be formed as an uppermost wiring layer in the multilayer wiring structure.

With reference to FIG. 16, the electronic component 131 includes an intermediate insulation layer 148. The intermediate insulation layer 148 is formed on a main surface insulation layer 7. In this embodiment, a peripheral edge of the intermediate insulation layer 148 is formed to be spaced from a peripheral edge of the substrate 6 toward an inner region of the substrate 6. A level difference portion is formed in a region between the peripheral edge of the intermediate insulation layer 148 and the peripheral edge of the substrate 6.

The intermediate insulation layer 148 may cover the entire first substrate main surface 9 of the substrate 6. In this case, the intermediate insulation layer 148 may be formed to be substantially flush with a substrate side surface 11 of the substrate 6. The intermediate insulation layer 148 may have a side surface which is flush with a sealing side surface 14 of a sealing insulation layer 8 and the substrate side surface 11 of the substrate 6.

The intermediate insulation layer 148 seals the MISFET chip 21, the diode chip 112, and the IC chip 132. The intermediate insulation layer 148 may include at least one type of silicon oxide, silicon nitride, epoxy resin, anf polyimide resin. In this embodiment, the intermediate insulation layer 148 is formed by an intermediate sealing resin layer including polyamide resin.

A gate contact hole 149, a source contact hole 150, a source sense contact hole 151, a drain contact hole 152, and a cathode contact hole 153 are formed in the intermediate insulation layer 148. An output contact hole 154, a first wiring contact hole 155, a second wiring contact hole 156, and an input contact hole 157 are formed in the intermediate insulation layer 148.

The gate contact hole 149 selectively exposes a gate terminal electrode layer 28 of the MISFET chip 21. The source contact hole 150 selectively exposes a source terminal electrode layer 29 of the MISFET chip 21.

The source sense contact hole 151 selectively exposes a source sense terminal electrode layer 30 of the MISFET chip 21. The drain contact hole 152 selectively exposes the first wiring layer 133.

The cathode contact hole 153 selectively exposes a cathode terminal electrode layer 117 of the diode chip 112. The output contact hole 154 selectively exposes the output terminal electrode layer 145 of the IC chip 132.

The first wiring contact hole 155 selectively exposes a region of the first wiring layer 133 which is different from the region exposed by the drain contact hole 152. The second wiring contact hole 156 selectively exposes the second wiring layer 134. The input contact hole 157 selectively exposes the third wiring layer 135.

The electronic component 131 includes a first connection wiring layer 161, a second connection wiring layer 162, and a third connection wiring layer 163. The first connection wiring layer 161, the second connection wiring layer 162, and the third connection wiring layer 163 are respectively formed on the intermediate insulation layer 148.

The first connection wiring layer 161 is selectively drawn on the intermediate insulation layer 148. The first connection wiring layer 161 is selectively drawn in a region between the source terminal electrode layer 29 and the second wiring layer 134. The first connection wiring layer 161 includes a first connection portion 164 and a second connection portion 165.

The first connection portion 164 is connected to the source terminal electrode layer 29 of the MISFET chip 21. More specifically, the first connection portion 164 enters the source contact hole 150 from above the intermediate insulation layer 148. The first connection portion 164 is connected to the source terminal electrode layer 29 in the source contact hole 150.

The second connection portion 165 is connected to the second wiring layer 134. More specifically, the second connection portion 165 enters the second wiring contact hole 156 from above the intermediate insulation layer 148. The second connection portion 165 of the first connection wiring layer 161 is connected to the second wiring layer 134 in the second wiring contact hole 156.

The second connection wiring layer 162 is selectively drawn on the intermediate insulation layer 148. The second connection wiring layer 162 is selectively drawn in a region between the cathode terminal electrode layer 117 and the first wiring layer 133. The second connection wiring layer 162 includes a first connection portion 166 and a second connection portion 167.

The first connection portion 166 is electrically connected to the cathode terminal electrode layer 117 of the diode chip 112. More specifically, the first connection portion 166 enters the cathode contact hole 153 from above the intermediate insulation layer 148. The first connection portion 166 is connected to the cathode terminal electrode layer 117 in the cathode contact hole 153.

The second connection portion 167 is electrically connected to the first wiring layer 133. More specifically, the second connection portion 167 enters the first wiring contact hole 155 from above the intermediate insulation layer 148. The second connection portion 167 is connected to the first wiring layer 133 in the first wiring contact hole 155.

The third connection wiring layer 163 is selectively drawn on the intermediate insulation layer 148. The third connection wiring layer 163 is selectively drawn in a region between the gate terminal electrode layer 28 and the output terminal electrode layer 145. The third connection wiring layer 163 includes a first connection portion 168 and a second connection portion 169.

The first connection portion 168 is electrically connected to the gate terminal electrode layer 28 of the MISFET chip 21. More specifically, the first connection portion 168 enters the gate contact hole 149 from above the intermediate insulation layer 148. The first connection portion 168 is connected to the gate terminal electrode layer 28 in the gate contact hole 149.

The second connection portion 169 is electrically connected to the output terminal electrode layer 145 of the IC chip 132. More specifically, the second connection portion 169 enters the output contact hole 154 from above the intermediate insulation layer 148. The second connection portion 169 of the third connection wiring layer 163 is connected to the output terminal electrode layer 145 in the output contact hole 154.

In this embodiment, the sealing insulation layer 8 seals the intermediate insulation layer 148 on the first substrate main surface 9 of the substrate 6. Thereby, the MISFET chip 21, the diode chip 112, and the IC chip 132 are collectively sealed by the intermediate insulation layer 148 and the sealing insulation layer 8.

The gate pad opening 33, the source pad opening 34, the source sense pad opening 35, the drain pad opening 36, and an input terminal pad opening 170 are formed in the sealing insulation layer 8. The drain pad opening 36 communicates with the drain contact hole 152. The input terminal pad opening 170 communicates with the input contact hole 157.

The gate external terminal 15 is embedded in the gate pad opening 33. The gate external terminal 15 is electrically connected to the gate terminal electrode layer 28 of the MISFET chip 21 via the first connection portion 168 of the third connection wiring layer 163.

The source external terminal 16 is embedded in the source pad opening 34. The source external terminal 16 is electrically connected to the source terminal electrode layer 29 of the MISFET chip 21 via the first connection portion 164 of the first connection wiring layer 161.

The source sense external terminal 17 is embedded in the source sense pad opening 35. The drain external terminal 18 is embedded in the drain pad opening 36. The input external terminal 136 is embedded in the input terminal pad opening 170.

Figure 17:
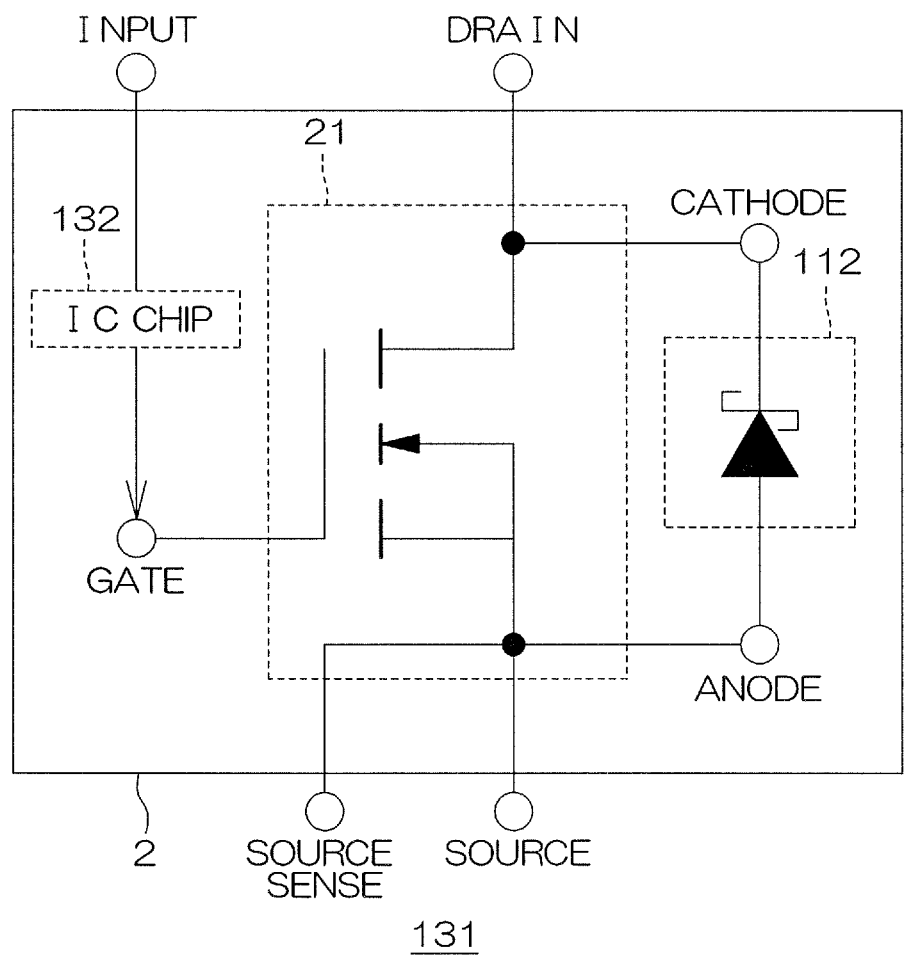
FIG. 17 is a circuit diagram for describing an electrical configuration of the electronic component shown in FIG. 15.

FIG. 17 is a circuit diagram for describing an electrical configuration of the electronic component 131 shown in FIG. 15.

With reference to FIG. 17, the diode chip 112 is connected to the MISFET chip 21. The diode chip 112 is connected to the MISFET chip 21 as a freewheel diode. The IC chip 132 is connected to a gate of the MISFET chip 21.

As described above, also with the electronic component 131, similar effects to the effects described for the electronic component 1 can be exerted.

With the electronic component 131, the MISFET chip 21, the diode chip 112, and the IC chip 132 are packaged as a single package. Thereby, by mounting the electronic component 131 on the object to be connected such as a mounting substrate, the MISFET chip 21, the diode chip 112, and the IC chip 132 can be mounted on the mounting substrate by a single step.

With the electronic component 131, the intermediate insulation layer 148 is interposed in a region between the first substrate main surface 9 of the substrate 6 and the sealing insulation layer 8. The intermediate insulation layer 148 covers the MISFET chip 21, the diode chip 112, and the IC chip 132.

The first connection wiring layer 161, the second connection wiring layer 162, and the third connection wiring layer 163 are formed on the intermediate insulation layer 148. That is, by the intermediate insulation layer 148, the first connection wiring layer 161, the second connection wiring layer 162, and the third connection wiring layer 163 can be made in a mode where the connection wiring layers are laminated along the normal direction of the first substrate main surface 9 of the substrate 6 with respect to the MISFET chip 21, the diode chip 112, and the IC chip 132.

Thereby, it is unnecessary to largely extend wiring connecting the MISFET chip 21, the diode chip 112, and the IC chip 132 in the lateral direction along the first substrate main surface 9 of the substrate 6. Thereby, the MISFET chip 21, the diode chip 112, and the IC chip 132 can be arranged close to each other.

Therefore, with the electronic component 131, in comparison to a case of individually mounting on the object to be connected such as a mounting substrate, an occupancy area of a circuit network including the MISFET chip 21, the diode chip 112, and the IC chip 132 in the object to be connected such as the mounting substrate can be reduced.

In the electronic component 131, a structure in which a cathode external terminal 122 and an anode external terminal 123 are formed may be adopted. In the electronic component 131, a structure in which an output external terminal (not shown) is connected to the output terminal electrode layer 145 of the IC chip 132 may be adopted. The output external terminal may have a similar structure to that of the gate external terminal 15, etc.

In the electronic component 131, a structure in which the first connection wiring layer 161, the second connection wiring layer 162, and the third connection wiring layer 163 are not formed may be adopted. In this case, the intermediate insulation layer 148 can be eliminated.

In the electronic component 131, a second diode chip 112 may be provided in place of the MISFET chip 21. In the electronic component 131, a plurality of (two or more) diode chips 112 may be provided. In the electronic component 131, the MISFET chip 21 may be eliminated.

In the electronic component 131, a second MISFET chip 21 may be provided in place of the diode chip 112. In the electronic component 131, a plurality of (two or more) MISFET chips 21 may be provided. In the electronic component 131, the diode chip 112 may be eliminated.

In the electronic component 131, an arbitrary IC chip other than the gate driver IC may be adopted as the IC chip 132. In the electronic component 131, the IC chip 132 may be eliminated.

In the electronic component 131, a passive device chip may be provided in place of or in addition to the IC chip 132. The passive device chip may include at least one type of a capacitor, a resistance, or an inductor.

A connection destination of the passive device chip is arbitrary. The passive device chip may be electrically connected to a gate, a source, or a drain of the MISFET chip 21. The passive device chip may be electrically connected to a cathode or an anode of the diode chip 112.

The structure of the second preferred embodiment, the structure of the third preferred embodiment, the structure of the fourth preferred embodiment, the structure of the fifth preferred embodiment, or the structure of the sixth preferred embodiment, or an arrangement in which arbitrary two, three, four, or five structures among these preferred embodiments are combined may be applied to the electronic component 131.

Figure 18:
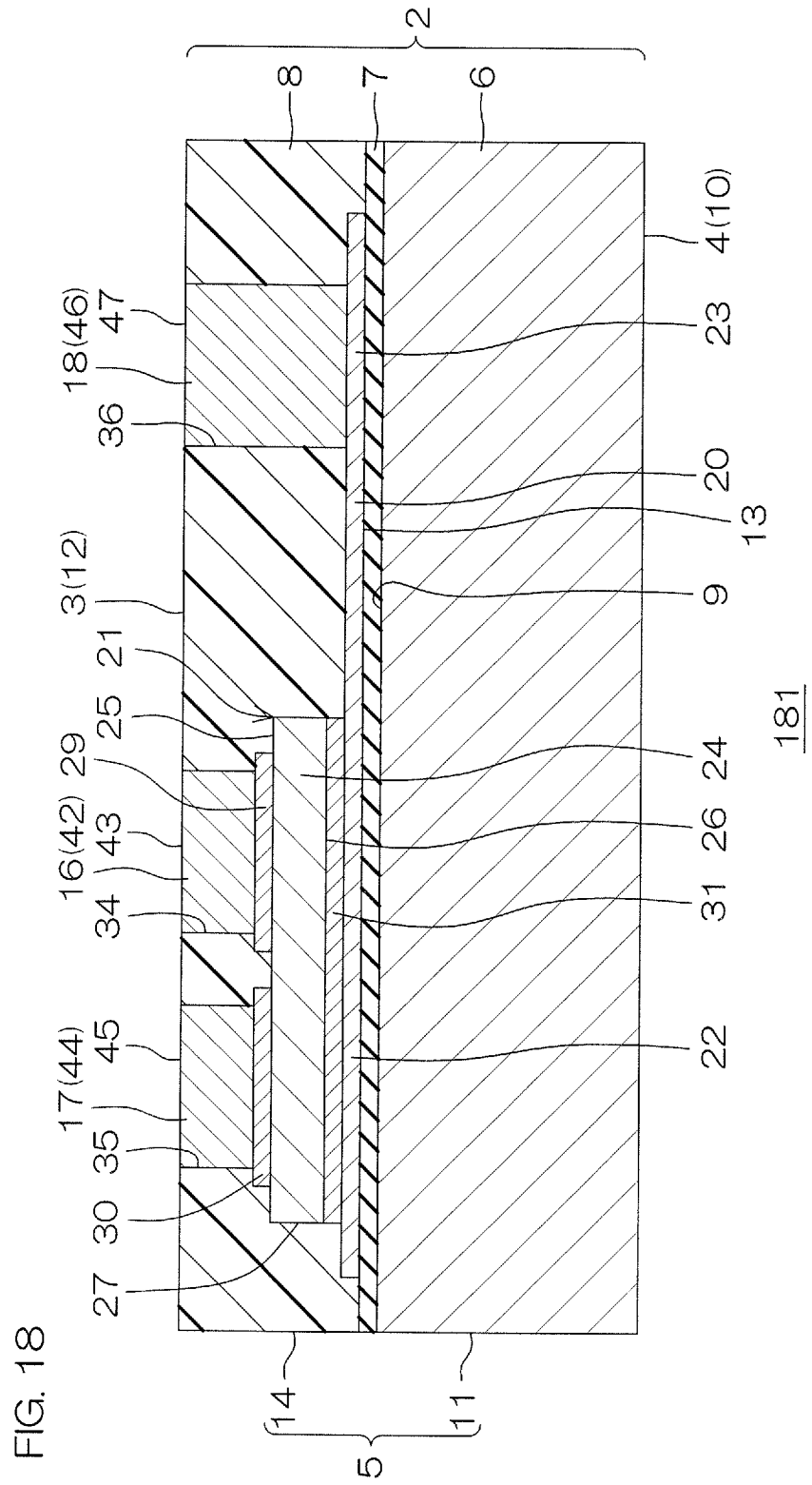
FIG. 18 is a sectional view of a part corresponding to FIG. 3, the view for describing a structure of an electronic component according to an eighth preferred embodiment of the present invention.

FIG. 18 is a sectional view of a part corresponding to FIG. 3, the view for describing a structure of an electronic component 181 according to an eighth preferred embodiment of the present invention. Hereinafter, structures corresponding to the structures described for the electronic component 1 will be given the same reference signs and description thereof will be omitted.

In the electronic component 181, a MISFET chip 21 is directly bonded to a wiring layer 20 via no conductive bonding material 32. More specifically, a drain terminal electrode layer 31 of the MISFET chip 21 is directly bonded to a first connection region 22 of the wiring layer 20.

The wiring layer 20 is formed by utilizing a burning process. In the burning process of the wiring layer 20, first, conductive paste serving as a base of the wiring layer 20 is applied onto a main surface insulation layer 7. The conductive paste may be copper paste.

Next, the MISFET chip 21 is arranged on the conductive paste such that the drain terminal electrode layer 31 is connected to the conductive paste. After that, the conductive paste is burnt. Thereby, the drain terminal electrode layer 31 is bonded to the wiring layer 20.

As described above, also with the electronic component 181, similar effects to the effects described for the electronic component 1 can be exerted.

The mode in which the MISFET chip 21 is directly bonded to the wiring layer 20 via no conductive bonding material 32 can be applied to the structure of the second preferred embodiment, the structure of the third preferred embodiment, the structure of the fourth preferred embodiment, the structure of the fifth preferred embodiment, the structure of the sixth preferred embodiment, and the structure of the seventh preferred embodiment.

For example, in the sixth preferred embodiment, as well as the MISFET chip 21, the diode chip 112 may be directly bonded to the wiring layer 20 via no conductive bonding material 119. Also, in the seventh preferred embodiment, as well as the MISFET chip 21, the diode chip 112 and the IC chip 132 may be directly bonded to the third wiring layer 135 via no conductive bonding material 147.

The preferred embodiments of the present invention are described above. However, the present invention can further be implemented in yet other modes.

In the respective preferred embodiments described above, a MISFET chip 21 provided with no source sense terminal electrode layer 30 may be adopted. In this case, a structure formed due to the source sense terminal electrode layer 30 such as the source sense external terminal 17 can be eliminated.

In the respective preferred embodiments described above, a MISFET chip 21 provided with no source sense terminal electrode layer 30 whose inductance is greater than that of the source terminal electrode layer 29 may be adopted.

In the respective preferred embodiments described above, the substrate 6 may include a metal substrate in place of the semiconductor substrate. The metal substrate may include a copper substrate, a gold substrate, or an aluminum substrate. As a matter of course, the metal substrate may be made of a metal material other than these metal materials.

In the respective preferred embodiments described above, the substrate 6 may include an insulating substrate in place of the semiconductor substrate. The insulating substrate may include a glass substrate, a ceramic substrate, or a resin substrate. As a matter of course, the insulating substrate may be made of an insulating material other than these insulating materials.

In the respective preferred embodiments described above, the main surface insulation layer 7 may be eliminated. In the respective preferred embodiments described above, in a case where the substrate 6 is an insulating body, the main surface insulation layer 7 may be eliminated.

In the respective preferred embodiments described above, the MISFET chip 21 formed by a so-called vertical device is described. However, the MISFET chip 21 may be a horizontal device. That is, the MISFET chip 21 may have a structure in which the gate terminal electrode layer 28, the source terminal electrode layer 29, the source sense terminal electrode layer 30, and the drain terminal electrode layer 31 are formed on the first chip main surface 25 of the chip main body 24. In this case, the drain external terminal 18 is formed on the first chip main surface 25 of the chip main body 24.

In the respective preferred embodiments described above, the diode chip 112 formed by a so-called vertical device is described. However, the diode chip 112 may be a horizontal device. That is, the diode chip 112 may have a structure in which the cathode terminal electrode layer 117 and the anode terminal electrode layer 118 are formed on the first chip main surface 114 of the chip main body 113. In this case, the anode external terminal 123 is formed on the first chip main surface 114 of the chip main body 113.

In the respective preferred embodiments described above, an IGBT chip including an IGBT (Insulated Gate Bipolar Transistor) which serves as an example of a semiconductor switching device may be adopted in place of the MISFET chip 21. In this case, the "source" of the MISFET is substituted by an "emitter" of the IGBT. Also, the "drain" of the MISFET is substituted by a "collector" of the IGBT.

The present application corresponds to Japanese Patent Application No. 2017-085614 filed in the Japan Patent Office on Apr. 24, 2017, and the entire disclosure of this application is incorporated herein by reference.

While the preferred embodiments of the present invention have been described in detail above, these are merely specific examples used to clarify the technical content of the present invention, and the present invention should not be interpreted as being limited to these specific examples, and the scope of the present invention shall be limited only by the appended claims.

REFERENCE SIGNS LIST

1 Electronic component
6 Substrate (semiconductor substrate)
7 Main surface insulation layer
8 Sealing insulation layer
9 First substrate main surface of substrate
10 Second substrate main surface of substrate
12 First sealing main surface of sealing insulation layer
14 Sealing side surface of sealing insulation layer
15 Gate external terminal
16 Source external terminal
17 Source sense external terminal
18 Drain external terminal
20 Wiring layer
21 MISFET chip
24 Chip main body of MISFET chip
25 First chip main surface of MISFET chip
26 Second chip main surface of MISFET chip
28 Gate terminal electrode layer of MISFET chip
29 Source terminal electrode layer of MISFET chip
30 Source sense terminal electrode layer of MISFET chip
31 Drain terminal electrode layer of MISFET chip
33 Gate pad opening
34 Source pad opening
35 Source sense pad opening
36 Drain pad opening
40 Gate pillar-shaped electrode layer of gate external terminal
41 Gate connection portion of gate external terminal
42 Source pillar-shaped electrode layer of source external terminal
43 Source connection portion of source external terminal
44 Source sense pillar-shaped electrode layer of source sense external terminal
45 Source sense connection portion of source sense external terminal
46 Drain pillar-shaped electrode layer of drain external terminal
47 Drain connection portion of drain external terminal
61 Electronic component
62 Gate conductive bonding layer of gate external terminal
63 Source conductive bonding layer of source external terminal
64 Source sense conductive bonding layer of source sense external terminal
65 Drain conductive bonding layer of drain external terminal
71 Electronic component
72 Gate electrode film of gate external terminal
73 Gate conductive bonding layer of gate external terminal
74 Covering portion of gate external terminal
75 Source electrode film of source external terminal
76 Source conductive bonding layer of source external terminal
77 Covering portion of source external terminal
78 Source sense electrode film of source sense external terminal
79 Source sense conductive bonding layer of source sense external terminal
80 Covering portion of source sense external terminal
81 Drain electrode film of drain external terminal
82 Drain conductive bonding layer of drain external terminal
83 Covering portion of drain external terminal
91 Electronic component
92 Heat dissipation structure
93 Fin structure
101 Electronic component
102 Heat dissipation structure
103 Heat dissipation member
111 Electronic component
112 Diode chip
113 Chip main body of diode chip
114 First chip main surface of diode chip
115 Second chip main surface of diode chip
117 Cathode terminal electrode layer of diode chip
118 Anode terminal electrode layer of diode chip
120 Cathode pad opening
121 Anode pad opening
122 Cathode external terminal
123 Anode external terminal
124 Cathode pillar-shaped electrode layer of cathode external terminal
125 Cathode connection portion of cathode external terminal
126 Anode pillar-shaped electrode layer of anode external terminal
127 Anode connection portion of anode external terminal
131 Electronic component
132 IC chip
133 First wiring layer
134 Second wiring layer
135 Third wiring layer
136 Input external terminal
141 Chip main body of IC chip
142 First chip main surface of IC chip
143 Second chip main surface of IC chip
145 Output terminal electrode layer of IC chip
146 Input terminal electrode layer of IC chip
148 Intermediate insulation layer
161 First connection wiring layer
162 Second connection wiring layer
163 Third connection wiring layer
181 Electronic component

The invention claimed is:

1. A semiconductor device comprising:
a semiconductor substrate having a first main surface on one side and a second main surface on the other side;
a main surface insulation layer formed on the first main surface of the semiconductor substrate, the main surface insulation layer having a sealing main surface that extends along the first main surface of the semiconductor substrate;
wiring layers that are formed on the main surface insulation layer;

a first semiconductor chip having a first chip front surface on one side and a first chip back surface on the other side, and including two electrodes formed on the first chip front surface and one electrode formed on the first chip back surface, the first semiconductor chip being arranged on a first wiring layer of the wiring layers;

a second semiconductor chip having an electrode on a front surface and an electrode on a back surface respectively, the second semiconductor chip being arranged on a second wiring layer of the wiring layers;

an intermediate insulation layer having:
   a first portion that seals a peripheral part of a top surface of one of the two electrodes, on the first chip front surface, that is closest to the second semiconductor chip, and all of a side surface of the first semiconductor chip that is closest to the second semiconductor chip, and
   a second portion that seals a peripheral part of an upper surface of the second semiconductor chip that is closest to the first semiconductor chip and all of a side surface of the second semiconductor chip that is closest to the first semiconductor chip, a sealing insulation layer that seals the first semiconductor chip, the second semiconductor chip and the intermediate insulation layer; and a connection wiring layer that is formed:
   along a top surface and a side surface of the first portion of the intermediate insulation layer,
   along a top surface of a center portion of the one of the two electrodes on the first chip front surface that is closest to the second semiconductor chip, and
   along a top surface of a part of one of the wiring layers that is electrically connected to the electrode formed on the back surface of the second semiconductor chip.

2. The semiconductor device according to claim 1, wherein the sealing insulation layer covers the intermediate insulation layer.

3. The semiconductor device according to claim 2, wherein
the intermediate insulation layer has a wiring contact hole selectively exposes the second wiring layer,
the connection wiring layer is connected to the second wiring layer in the wiring contact hole.

4. The semiconductor device according to claim 1, further comprising:
external terminals formed to penetrate through the sealing insulation layer so as to be exposed from the sealing main surface of the sealing insulation layer and each electrically connected to a corresponding electrode of the first semiconductor chip.

5. The semiconductor device according to claim 1, wherein
the sealing insulation layer exposes the second main surface of the semiconductor substrate.

6. The semiconductor device according to claim 1, wherein
a thickness of the semiconductor substrate is thicker than a thickness of the sealing insulation layer.

7. The semiconductor device according to claim 1, wherein
a thickness of the main surface insulation layer is thinner than a thickness of the first semiconductor chip and a thickness of the second semiconductor chip.

8. The semiconductor device according to claim 4, wherein the sealing main surface of the sealing insulation layer forms a mounting surface, and
all of the external terminals are exposed from the mounting surface.

9. The semiconductor device according to claim 8, wherein
the semiconductor substrate includes a side surface connecting the first main surface and the second main surface, and
the sealing insulation layer exposes the side surface of the semiconductor substrate.

10. The semiconductor device according to claim 9, wherein
the sealing insulation layer includes a sealing side surface formed to be flush with the side surface of the semiconductor substrate.

11. The semiconductor device according to claim 4, wherein
the first semiconductor chip comprises a circuit device, and
the external terminals include chip side external terminals penetrating through the sealing insulation layer, each chip side external terminal being respectively electrically connected to a corresponding electrode of the first semiconductor chip.

12. The semiconductor device according to claim 4, wherein
the external terminals include a wiring layer side external terminal penetrating through the sealing insulation layer, the wiring layer side external terminal being connected to the connection wiring layer.

13. The semiconductor device according to claim 1, wherein
the main surface insulation layer includes at least one material selected from a group including silicon oxide, silicon nitride, silicon oxynitride, aluminum oxide, aluminum nitride, and aluminum oxynitride.

14. The semiconductor device according to claim 1, further comprising:
a heat dissipation structure formed by a body of the semiconductor substrate including the second main surface, the heat dissipation structure that dissipates heat generated in the first semiconductor chip and the second semiconductor chip to an outside.

15. The semiconductor device according to claim 14, wherein
the heat dissipation structure includes a fin structure formed through the second main surface of the semiconductor substrate.

16. The semiconductor device according to claim 14, wherein
the heat dissipation structure includes a heat dissipation member that covers the second main surface of the semiconductor substrate.

17. The semiconductor device according to claim 4, wherein
the external terminals each includes a pillar-shaped electrode layer standing in a pillar shape on the corresponding electrode of the first semiconductor chip and extending along a normal direction to the first main surface of the semiconductor substrate.

18. The semiconductor device according to claim 17, wherein
the pillar-shaped electrode layer includes a connection portion to be connected to an outside, and the connection portion of the pillar-shaped electrode layer is formed to be flush with the sealing main surface of the sealing insulation layer.

19. The semiconductor device according to claim 18, wherein
each of the external terminals includes a conductive bonding layer formed on the pillar-shaped electrode layer.

20. The semiconductor device according to claim 19, wherein
the entire conductive bonding layer is exposed from the sealing main surface of the sealing insulation layer.

21. The semiconductor device according to claim 4, wherein
the sealing insulation layer has openings that are formed in the sealing main surface, and
each of the external terminals includes an electrode film formed in a film shape along an inner wall of a corresponding opening.

22. The semiconductor device according to claim 21, wherein
each of the external terminals includes a conductive bonding layer formed on the electrode film.

23. The semiconductor device according to claim 22, wherein
the electrode film includes a covering portion that covers the sealing main surface of the sealing insulation layer on an outside of the opening, and
the conductive bonding layer fills the opening and covers the covering portion of the electrode film on the outside of the opening.

24. The semiconductor device according to claim 1, wherein
the first semiconductor chip comprises a Metal Insulator Semiconductor Field Effect Transistor (MISFET) having a source, a drain, and a gate, and
the second semiconductor chip comprises a diode having a cathode electrically connected to the drain of the first semiconductor chip, and an anode electrically connected to the source of the first semiconductor chip.

25. The semiconductor device according to claim 1, wherein the first semiconductor chip comprises a Metal Insulator Semiconductor Field Effect Transistor (MISFET) having a source, a drain, and a gate;
wherein the semiconductor device further comprises a third semiconductor chip that controls the gate of the MISFET.

26. The semiconductor device according to claim 24, wherein
the MISFET is a vertical or horizontal device made of silicon, silicon carbide, or a nitride semiconductor, and has a withstand voltage of not less than 600 V.

27. The semiconductor device according to claim 1, wherein
the first semiconductor chip comprises an Insulated Gate Bipolar Transistor (IGBT) having an emitter, a collector, and a gate, and
the second semiconductor chip comprises a diode having a cathode electrically connected to the collector of the first semiconductor chip, and an anode electrically connected to the emitter of the first semiconductor chip.

28. The semiconductor device according to claim 27, wherein
the IGBT is a vertical or horizontal device made of silicon, silicon carbide, or a nitride semiconductor, and has a withstand voltage of not less than 600 V.

29. The semiconductor device according to claim 13, wherein
the main surface insulation layer has a thickness of not less than 0.1 µm and not more than 100 µm.

30. The semiconductor device according to claim 3, wherein
the second wiring layer has a lead-out part that leads out from an outer edge of the second semiconductor chip, and
the connection wiring layer is directly connected to the lead-out part of the second wiring layer.

31. The semiconductor device according to claim 3, wherein
the intermediate insulation layer, in a sectional view, includes a first part on a first semiconductor chip side relative to the wiring contact hole and a second part on a second semiconductor chip side relative to the wiring contact hole,
the first part of the intermediate insulation layer covers the side surface of the first semiconductor chip,
the second part of the intermediate insulation layer covers the side surface of the second semiconductor chip, and
the connection wiring layer integrally straddles a side surface of the first part of the intermediate insulation layer and a side surface of the second part of the intermediate insulation layer.

* * * * *